US012588267B2

(12) United States Patent
Young et al.

(10) Patent No.: US 12,588,267 B2
(45) Date of Patent: Mar. 24, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Bo-Feng Young, Taipei (TW); Sai-Hooi Yeong, Hsinchu County (TW); Chi-On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/357,163

(22) Filed: Jul. 24, 2023

(65) Prior Publication Data

US 2023/0361190 A1     Nov. 9, 2023

Related U.S. Application Data

(63) Continuation of application No. 17/579,613, filed on Jan. 20, 2022, now Pat. No. 11,791,393, which is a
(Continued)

(51) Int. Cl.
| | |
|---|---|
| *H10D 64/27* | (2025.01) |
| *H10D 30/01* | (2025.01) |
| *H10D 30/62* | (2025.01) |
| *H10D 62/10* | (2025.01) |
| *H10D 64/01* | (2025.01) |

(52) U.S. Cl.
CPC ....... *H10D 64/519* (2025.01); *H10D 30/0243* (2025.01); *H10D 30/62* (2025.01); *H10D 62/118* (2025.01); *H10D 64/01* (2025.01);

*H10D 64/017* (2025.01); *H10D 64/018* (2025.01); *H10D 30/6219* (2025.01)

(58) Field of Classification Search
CPC ............. H01L 29/4238; H01L 29/0665; H01L 29/401; H01L 29/66545; H01L 29/66553; H01L 29/6681; H01L 29/785; H01L 2029/7858
See application file for complete search history.

(56) References Cited

U.S. PATENT DOCUMENTS 9,209,247 B2    12/2015    Colinge et al.
9,236,267 B2    1/2016    De et al.
(Continued)

OTHER PUBLICATIONS ip.com Search History (Year: 2025).*

*Primary Examiner* — Zandra V Smith
*Assistant Examiner* — Andre C Stevenson
(74) *Attorney, Agent, or Firm* — JCIPRNET

(57) ABSTRACT

Provided are a semiconductor device and a method of forming the same. The semiconductor device includes a substrate, a plurality of semiconductor nanosheets, a bottom dielectric layer, and a gate stack. The substrate includes at least one fin. The plurality of semiconductor nanosheets are stacked on the at least one fin. The bottom dielectric layer is vertically disposed between the at least one fin and the plurality of semiconductor nanosheets. The gate stack wraps the plurality of semiconductor nanosheets. An area of the gate stack projected on a top surface of the substrate is within an area of the bottom dielectric layer projected on the top surface of the substrate.

20 Claims, 30 Drawing Sheets

Related U.S. Application Data continuation of application No. 16/798,440, filed on Feb. 24, 2020, now Pat. No. 11,233,130.

(60) Provisional application No. 62/925,770, filed on Oct. 25, 2019.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,991,352 B1 * | 6/2018 | Frougier | H01L 29/42364 |
| 2006/0234456 A1 * | 10/2006 | Anderson | G11C 16/0475 |
| | | | 257/E27.103 |
| 2012/0104470 A1 * | 5/2012 | Ponoth | H10D 30/608 |
| | | | 257/288 |
| 2020/0027959 A1 * | 1/2020 | Cheng | H10D 64/679 |
| 2021/0119031 A1 * | 4/2021 | Song | H10D 30/6735 |

* cited by examiner

SEMICONDUCTOR DEVICE AND METHOD OF FORMING THE SAME

CROSS-REFERENCE TO RELATED APPLICATION

This is a continuation application of and claims the priority benefit of U.S. application Ser. No. 17/579,613, filed on Jan. 20, 2022, now allowed. The U.S. application Ser. No. 17/579,613 is a continuation application of and claims the priority benefit of U.S. application Ser. No. 16/798,440, filed on Feb. 24, 2020, now U.S. Pat. No. 11,233,130, issued on Jan. 25, 2022, which claims the priority benefit of U.S. provisional application Ser. No. 62/925,770, filed on Oct. 25, 2019. The entirety of each of the above-mentioned patent applications is hereby incorporated by reference herein and made a part of this specification.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, multi-gate devices have been introduced to replace planar transistors. On the other hands, the smaller feature size may lead to more leakage current. As the demand for even smaller electronic devices has grown recently, there has grown a need for reducing leakage current of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
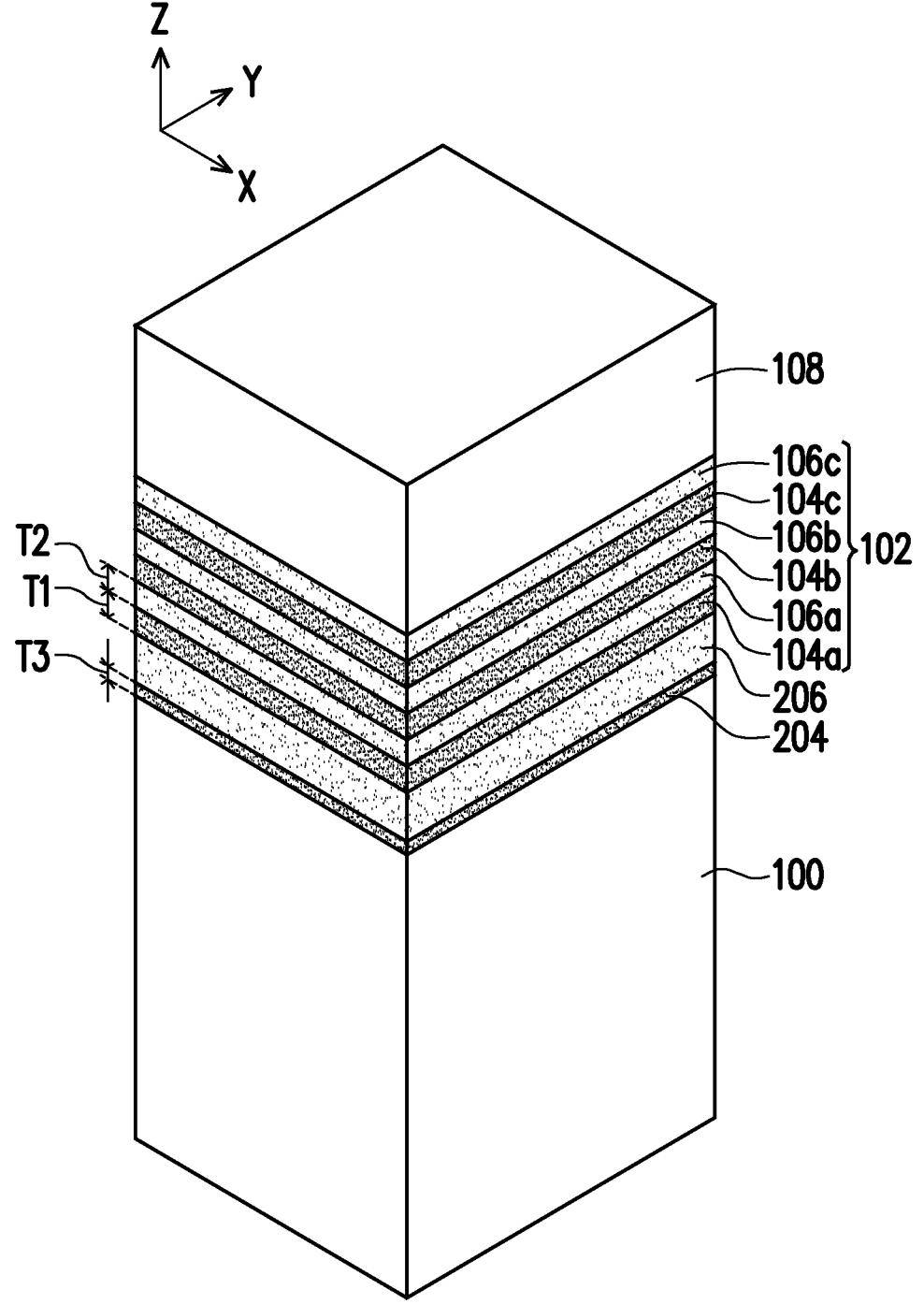
FIG. 1 to FIG. 13 are perspective views of intermediate stages in the formation of a semiconductor device in accordance with a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheets) or any number of channels.

One of ordinary skill may recognize other examples of semiconductor devices that may benefit from aspects of the present disclosure.

In accordance with some embodiments, a bottom dielectric layer is formed below a gate stack to block the punch through leakage current between adjacent source/drain (S/D) regions, thereby enhancing the device performance and the reliability. In addition, the bottom dielectric layer may prevent dopants in the substrate (e.g., phosphorous in the n-well and boron in the p-well) from diffusing upwardly into the S/D regions, thereby maintaining the device performance. Moreover, the bottom dielectric layer may combine APT region above and below the bottom dielectric layer to further block the punch through leakage current.

FIG. 1 to FIG. 13 are perspective views of intermediate stages in the formation of a semiconductor device in accordance with a first embodiment of the disclosure. The semiconductor device illustrated in the following embodiments may be applied to, but not limited thereto, a fin field-effect transistor (FinFET), gate-all-around (GAA) FET, or other transistors including a multi-gate.

Referring to FIG. 1, a substrate 100 is provided. In some embodiments, the substrate 100 includes a crystalline silicon substrate (e.g., wafer). The substrate 100 may include various doped regions (e.g., p-type well and/or n-type well) depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. For clarity, the doped regions are not illustrated in FIG. 1 and subsequent drawings. In some alternative embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

As shown in FIG. 1, a bottom semiconductor material 204 is then formed on the substrate 100. In some embodiments, the bottom semiconductor material 204 includes SiGe, Ge, Si, or a combination thereof, and may be formed by an epitaxial growth process, such as a molecular beam epitaxy (MBE) process, a metalorganic chemical vapor deposition (MOCVD) process, or the like. In the case, the bottom semiconductor material 204 may be an epitaxial SiGe layer. In some alternative embodiments, the bottom semiconductor material 204 is formed by a suitable deposition, such as chemical vapor deposition (CVD), atomic layer deposition (ALD), or the like. In the case, the bottom semiconductor material 204 may be a poly-SiGe layer. In some other embodiments, the bottom semiconductor material 204 has a thickness T3 in a range from about 5 nm to about 10 nm.

Thereafter, a buffer material 206 is formed on the bottom semiconductor material 204, and the bottom semiconductor material 204 is sandwiched between the buffer material 206 and the substrate 100. In some embodiments, the buffer material 206 includes an undoped silicon layer, a SiGe layer, or a combination thereof, that has a lower resistance than the substrate 100. In some alternative embodiments, the buffer material 206 and the bottom semiconductor material 204 have different materials. The buffer material 206 may be formed by an epitaxial growth process, such as a MBE process, a MOCVD process, or the like. In the case, the buffer material 206 may be an epitaxial Si layer. In some alternative embodiments, the buffer material 206 is formed by a suitable deposition, such as CVD, ALD, or the like. In the case, the buffer material 206 may be a poly-Si layer. In some other embodiments, the buffer material 206 has a thickness greater than the thickness T3 of the bottom semiconductor material 204.

As shown in FIG. 1, a semiconductor stack 102 is formed on the buffer material 206. The semiconductor stack 102 may include a plurality of first layers 104a, 104b, 104c (collectively referred to as "first layers 104") and a plurality of second layers 106a, 106b, 106c (collectively referred to as "second layers 106") stacked alternately in a Z direction. Although only three first layers 104 and three second layers 106 are illustrated in FIG. 1, the embodiments of the present disclosure are not limited thereto. In other embodiments, the number of the first layers 104 and the second layers 106 are adjusted by the need, such as one first layer, two first layers, four first layers, or more first layers. The number of the second layers corresponds to the number of the first layers.

In some embodiments, the first layers 104 and the second layers 106 include different materials. For example, the first layers 104 are SiGe layers having a germanium percentage in the range between about 10 wt % and 40 wt %, and the second layers 106 are Si layers free from germanium. However, the embodiment of the disclosure is not limited thereto, in other embodiments, the first layers 104 and the second layers 106 have materials with different etching selectivities. In some embodiments, the first layers 104 and the second layers 106 are formed by an epitaxial growth process, such as a MBE process, a MOCVD process, or the like. In the case, the first layers 104 are epitaxial SiGe layers, and the second layers 106 are epitaxial Si layers. In some alternative embodiments, the first layers 104 and the second layers 106 are formed by a suitable deposition, such as CVD, ALD, or the like. In the case, the first layers 104 are poly-SiGe layers, and the second layers 106 are poly-Si layers.

In some embodiments, the first layers 104 have the same thickness T1 and the second layers 106 have the same thickness T2. In some embodiments, the thickness T1 may be in a range from about 5 nm to about 20 nm and the thickness T2 may be in a range from about 5 nm to about 20 nm. Alternatively, the first layers 104a, 104b, and 104c may have different thicknesses, and the second layers 106a, 106b, and 106c may have different thicknesses. In some other embodiments, the first layers 104 and the second layers 106 have the same or different thicknesses. In some embodiments, the thickness T3 of the bottom semiconductor material 204 is less than the thickness T1 of the first layers 104 and/or less than the thickness T2 of the second layers 106. A ratio of the thickness T1 or T2 to the thickness T3 may be greater than or equal to 2, namely, T1/T3 ≥2 or T2/T3 ≥2.

As shown in FIG. 1, a mask layer 108 is formed on the semiconductor stack 102. The mask layer 108 may include a single-layered structure, a two-layered structure, or a multi-layered structure. For example, the mask layer 108 includes a silicon oxide (SiO) layer and a silicon nit1ride (SiN) layer on the SiO layer. In some embodiments, the mask layer 108 is formed by CVD, ALD, or the like.

Figure 2:
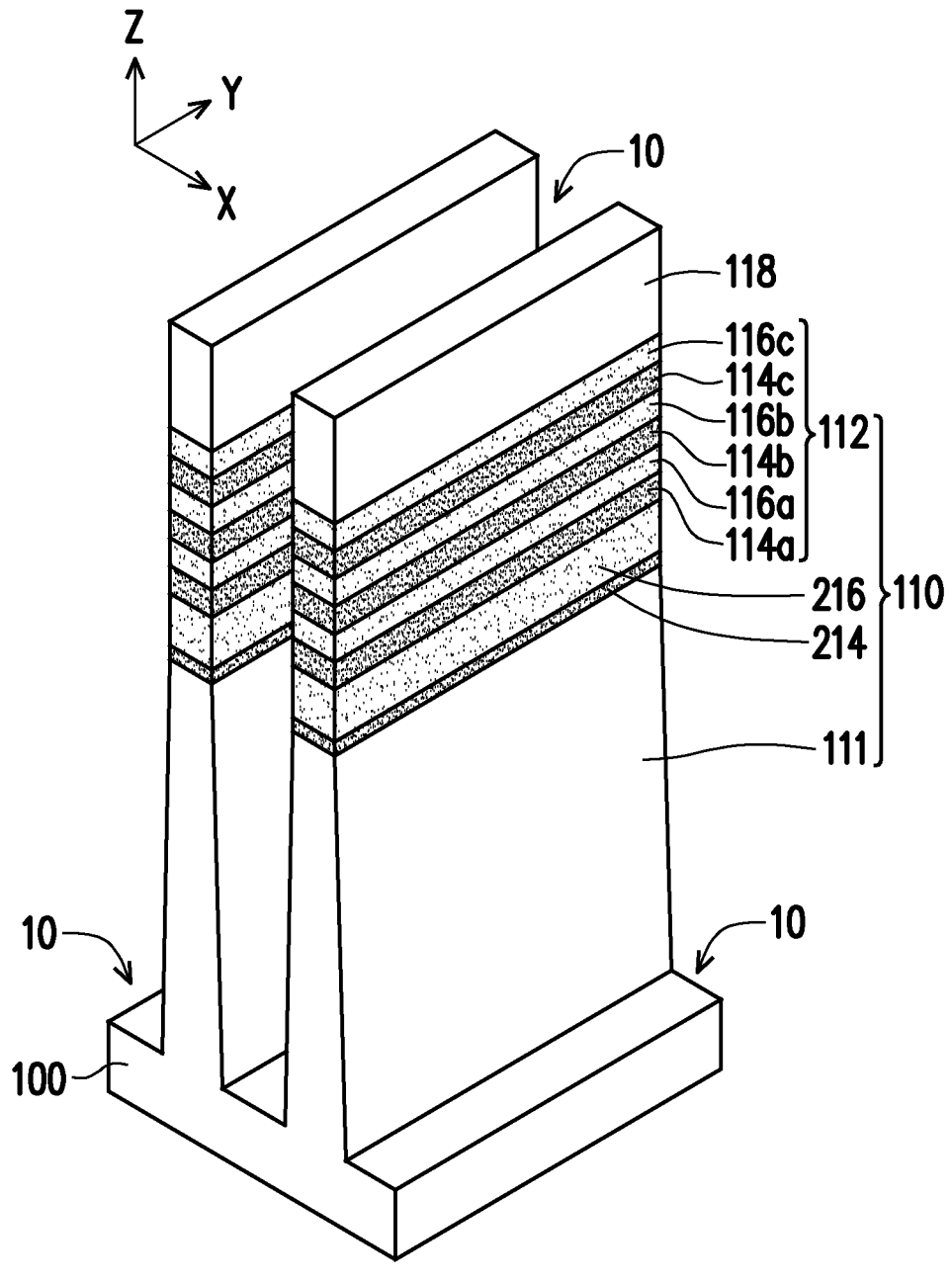

Referring to FIG. 1 and FIG. 2, the mask layer 108 is patterned to form a plurality of mask strips 118. The semiconductor stack 102, the buffer material 206, the bottom semiconductor material 204, and the substrate 100 are then patterned by using the mask strips 118 as a mask, so as to form a plurality of trenches 10. In the case, a plurality of fins 111, a plurality of bottom semiconductor layers (or strips) 214, a plurality of buffer layers (or strips) 216, and a plurality of stacks of semiconductor strips 112 are formed between the trenches 10. As shown in FIG. 2, the trenches 10 extend into the substrate 100, and have lengthwise directions parallel to each other. Herein, the stacks of semiconductor strips 112 may be referred to as nanosheet stacks 112 and the combination of the fins 111, the bottom semiconductor layers 214, the buffer layers 216, and the nanosheet stacks 112 may be referred to as hybrid fins 110, alternatively. Although only two hybrid fins 110 are illustrated in FIG. 2, the embodiments of the present disclosure are not limited thereto. In other embodiments, the number of the hybrid fins 110 may be adjusted by the need, such as one hybrid fin, three hybrid fins, four hybrid fins, or more hybrid fins. In addition, the mask strips 118 illustrated in FIG. 2 have flat top surfaces. However, the embodiments of the present disclosure are not limited thereto. In other embodiments, the mask strips 118 may have dome top surfaces due to the high aspect ratio etching.

As shown in FIG. 2, in some embodiments, the nanosheet stack 112 include a plurality of first nanosheets 114a, 114b, 114c (collectively referred to as "first nanosheets 114") and a plurality of second nanosheets 116a, 116b, 116c (collectively referred to as "second nanosheets 116") stacked alternately along a Z direction and extending along a Y direction. The bottom semiconductor layers 214 and the buffer layers 216 are disposed between the fins 111 and the nanosheet stacks 112 and also extending along the Y direction.

Figure 3:
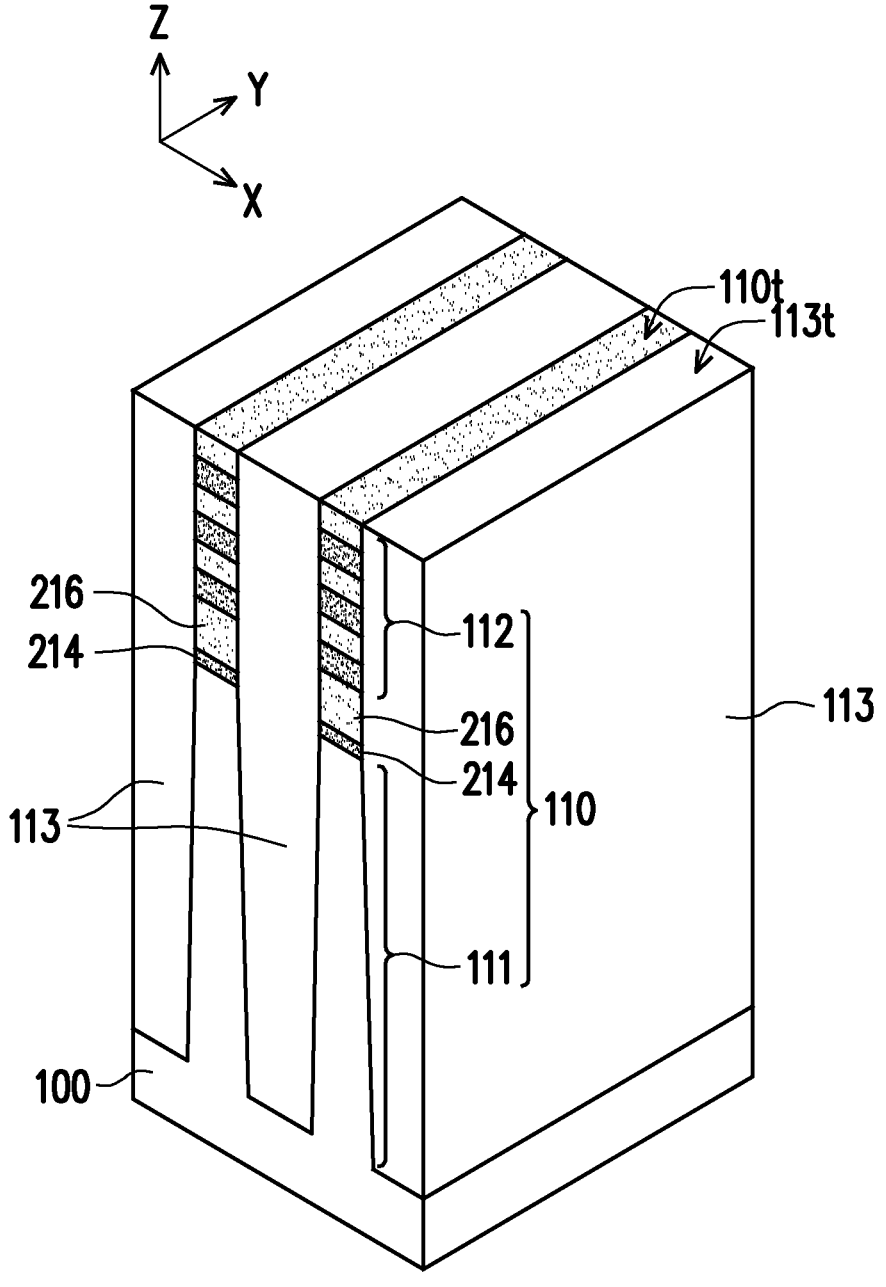

Referring to FIG. 2 and FIG. 3, a plurality of insulating layers 113 are formed in trenches 10. In detail, in some embodiments, an insulating material is formed on the substrate 100 to cover the hybrid fins 110 and to fill up the trenches 10. In addition to the hybrid fins 110, the insulating material further covers the mask strips 118. The insulating material may include silicon oxide, silicon nitride, silicon oxynitride, a spin-on dielectric material, or a low-k dielectric material. Herein, the low-k dielectric materials are generally dielectric materials having a dielectric constant lower than 3.9. The insulating material may be formed by flowable chemical vapor deposition (FCVD), high-density-plasma chemical vapor deposition (HDP-CVD), sub-atmospheric CVD (SACVD), or spin on. A planarization process may be performed, to remove a portion of the insulating material and the mask strips 118 until the hybrid fins 110 are exposed. In the case, as shown in FIG. 3, top surfaces 110t of the hybrid fins 110 are substantially coplanar with a top surface 113t of the planarized insulating material or insulating layers 113. In some embodiments, the planarization process includes a chemical mechanical polish (CMP), an etching back process, a combination thereof, or the like.

Figure 4:
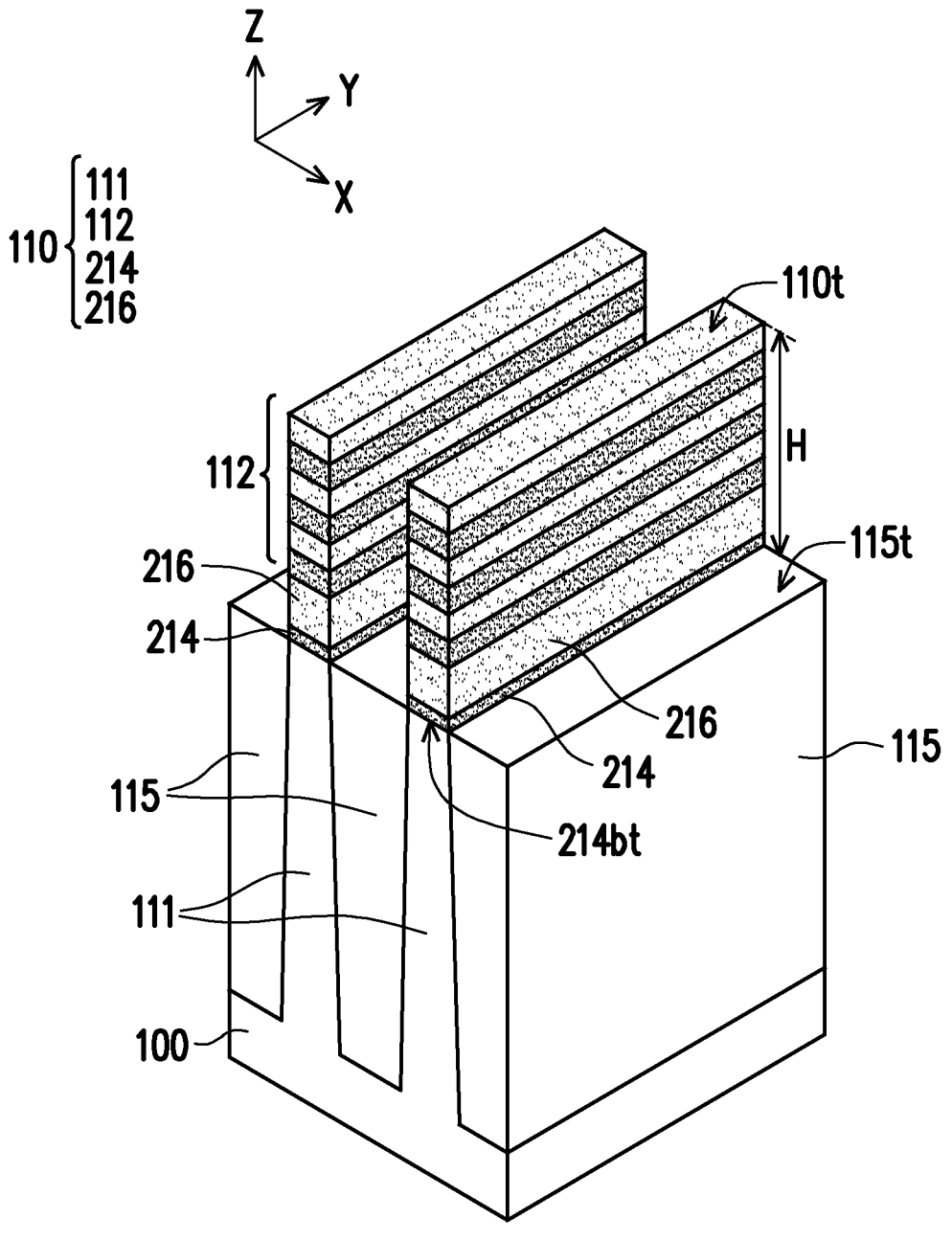

Referring to FIG. 3 and FIG. 4, the insulating layers 113 are recessed to form a plurality of isolation regions 115. After recessing the insulating layers 113, the hybrid fins 110 protrude from top surfaces 115t of the isolation regions 115. That is, the top surfaces 115t of the isolation regions 115 may be lower than the top surfaces 110t of the hybrid fins 110. In some embodiments, the nanosheet stacks 112, the buffer layers 216, and the bottom semiconductor layers 214 are exposed by the isolation regions 115. That is, the top surfaces 115t of the isolation regions 115 may be substantially coplanar with or lower than bottom surfaces 214bt of the bottom semiconductor layers 214. Further, the top surfaces 115t of the isolation regions 115 may have a flat surface as illustrated, a convex surface, a concave surface (such as dishing), or a combination thereof. In some embodiments, the insulating layers 113 are recessed by using an appropriate etching process, such as a wet etching process with hydrofluoric acid (HF), a dry etching process, or a combination thereof. In some embodiments, a height difference H between the top surfaces 110t of the hybrid fins 110 and the top surfaces 115t of the isolation regions 115 ranges from about 30 nm to about 100 nm. In some embodiments, the isolation regions 115 may be shallow trench isolation (STI) regions, deep trench isolation (DTI) regions, or the like.

Figure 5:
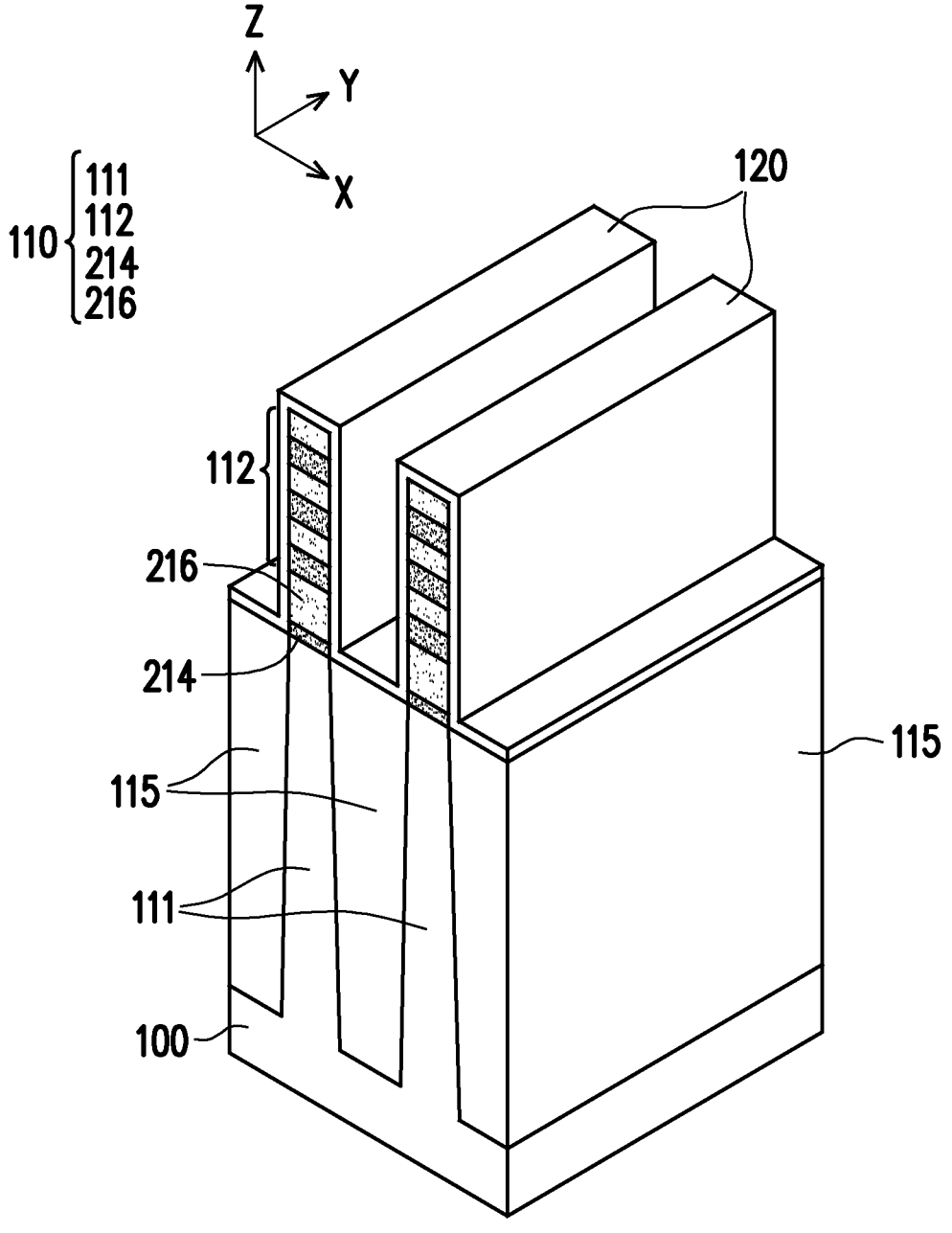

Referring to FIG. 4 and FIG. 5, a dummy dielectric layer 120 is formed on the substrate 100. In detail, as shown in FIG. 5, the dummy dielectric layer 120 conformally cover the surfaces of the nanosheet stacks 112, the buffer layers 216, the bottom semiconductor layers 214, and the top surfaces 115t of the isolation regions 115. In some embodiments, the dummy dielectric layer 120 includes silicon oxide, silicon nitride, silicon oxynitride, or the like, and may be formed by CVD, ALD or the like. In some alternative embodiments, the dummy dielectric layer 120 and the isolation regions 115 have the same or different dielectric materials.

Figure 6:
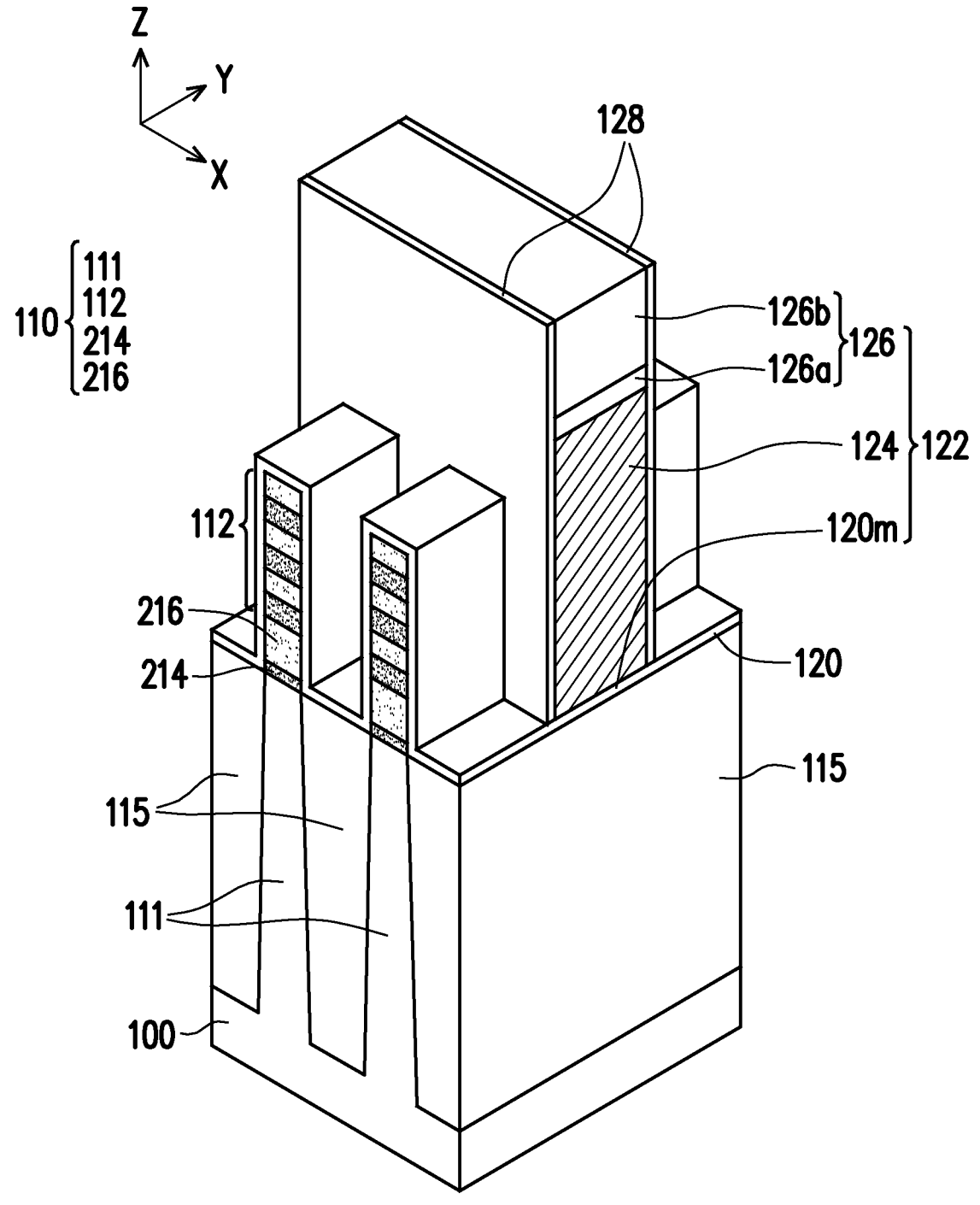

Referring to FIG. 6, a dummy gate stack 122 is formed on portions of the nanosheet stacks 112, portions of the buffer layers 216, portions of the bottom semiconductor layers 214, and portion of the isolation regions 115. The dummy gate stack 122 may extend along a X direction perpendicular to the extending direction of the nanosheet stacks 112, the buffer layers 216, and the bottom semiconductor layers 214. That is, the dummy gate stack 122 may be formed across the nanosheet stacks 112, the buffer layers 216, and the bottom semiconductor layers 214.

Specifically, the dummy gate stack 122 may include dummy gate electrode 124 and a portion of the dummy dielectric layer 120 covered by the dummy gate electrode 124. Herein, the portion of the dummy dielectric layer 120 covered by the dummy gate electrode 124 may be referred to as dummy gate dielectric layer 120m. In some embodiments, the dummy gate electrode 124 includes a silicon-containing material, such as poly-silicon, amorphous silicon, or a combination thereof. The dummy gate electrode 124 may be formed by using a suitable process, such as ALD, CVD, PVD, plating, or combinations thereof. Although the dummy gate electrode 124 illustrated in FIG. 6 is a single-layered structure, the embodiments of the present disclosure are not limited thereto. In other embodiments, the dummy gate electrode 124 may be a multi-layered structure. The dummy gate stack 122 may also include hard mask layer 126 over dummy gate electrode 124. In some embodiments, the hard mask layer 126 includes a single-layered structure, a two-layered structure, a multi-layered structure. For example, the hard mask layer 126 includes a silicon oxide layer 126a and a silicon nitride layer 126b over the silicon oxide layer 126a.

As shown in FIG. 6, a pair of spacers 128 are also formed on sidewalls of the dummy gate stack 122. In some embodiments, the spacers 128 and the dummy gate stack 122 have the same extending direction, namely, the X direction. Similar to the dummy gate stack 122, the spacers 128 are also formed across the nanosheet stacks 112, the buffer layers 216, and the bottom semiconductor layers 214. In some embodiments, the spacers 128 are formed of dielectric materials, such as silicon oxide, silicon nitride, carbonized silicon nitride (SiCN), SiCON, or a combination thereof. Although the spacers 128 illustrated in FIG. 6 is a single-layered structure, the embodiments of the present disclosure are not limited thereto. In other embodiments, the spacers 128 may be a multi-layered structure. For example, the spacer 128 may include a silicon oxide layer and a silicon nitride layer on the silicon oxide layer. As shown in FIG. 6, the dummy gate stack 122 and the spacers 128 cover middle portions of the nanosheet stacks 112, the buffer layers 216, the bottom semiconductor layers 214, and reveal the opposite end portions not covered.

Figure 7:
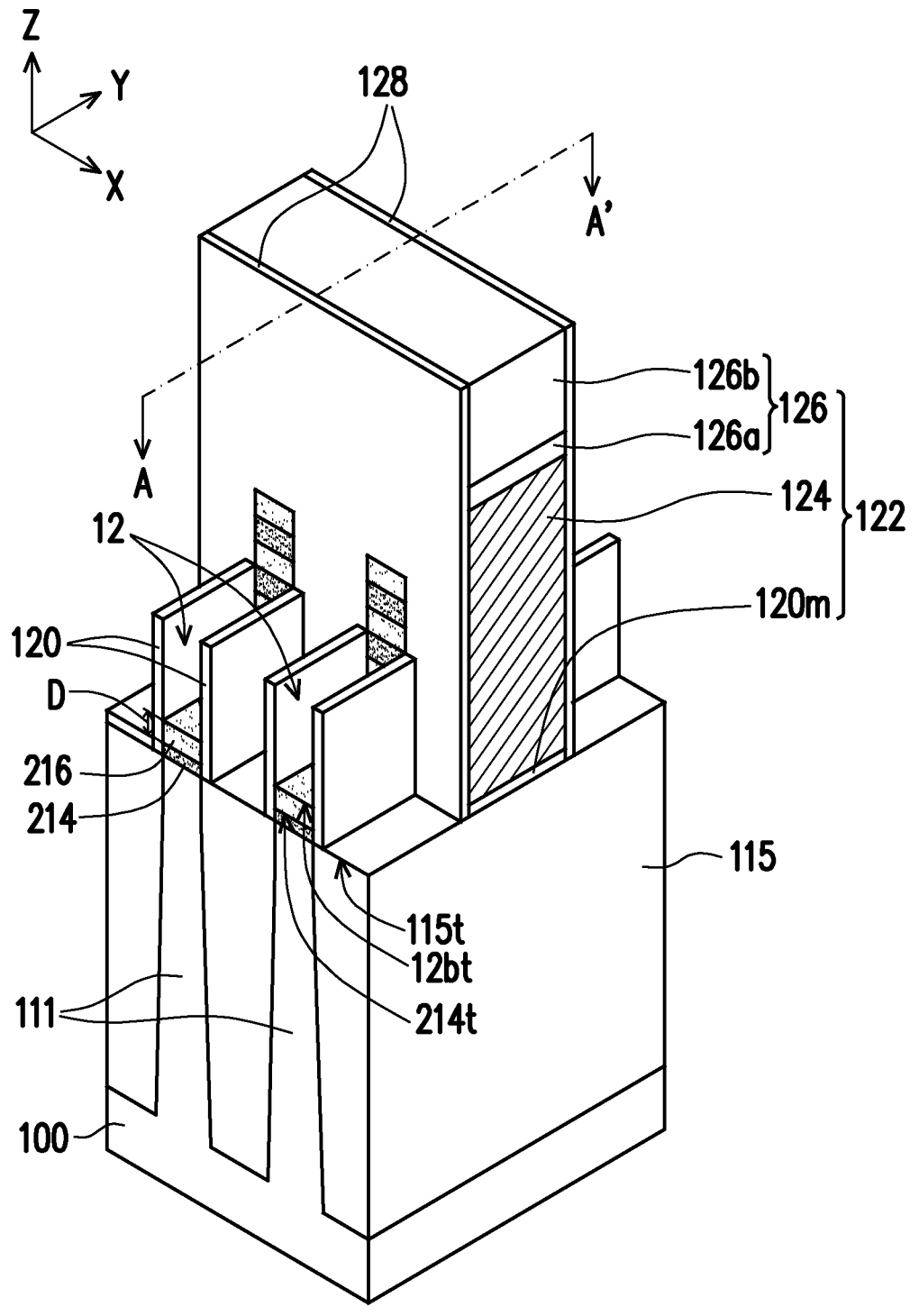

Referring to FIG. 6 and FIG. 7, the end portions of the nano sheet stacks 112 are removed and recessed to form recesses 12. Herein, the recesses 12 may be referred to as source/drain (S/D) recesses 12. In some embodiments, the end portions of the nanosheet stacks 112 may be removed by an anisotropic etching process, an isotropic etching process, or a combination thereof. In some embodiments, the S/D recesses 12 further extend into the buffer layers 216 and are not in contact with the bottom semiconductor layers 214. That is, the end portions of the nanosheet stacks 112 are entirely removed and portions of the buffer layers 216 are further removed. In the case, as shown in FIG. 7, the S/D recesses 12 have bottom surfaces 12bt lower than the top surfaces 115t of the isolation regions 115 and a non-zero distance D (or a portion of the buffer layer 216) is included between the bottom surfaces 12bt of the S/D recesses 12 and top surfaces 214t of the bottom semiconductor layers 214. In some embodiments, the non-zero distance D ranges from about 5 nm to about 50 nm. In addition, some portions of the dummy dielectric layer 120 are removed and other portions of the dummy dielectric layer 120 may be left standing over and aligned to the edges of isolation regions 115, with the S/D recesses 12 formed therebetween. Further, portions of the dummy dielectric layer 120 (in FIG. 6) covered by the spacers 128 may be considered to as portions of the spacers 128 as shown in FIG. 7. The spacers 128 may cover sidewalls of the dummy gate stack 122 which includes the dummy gate dielectric layer 120m, the dummy gate electrode 124, and the hard mask layer 126.

Figure 8:
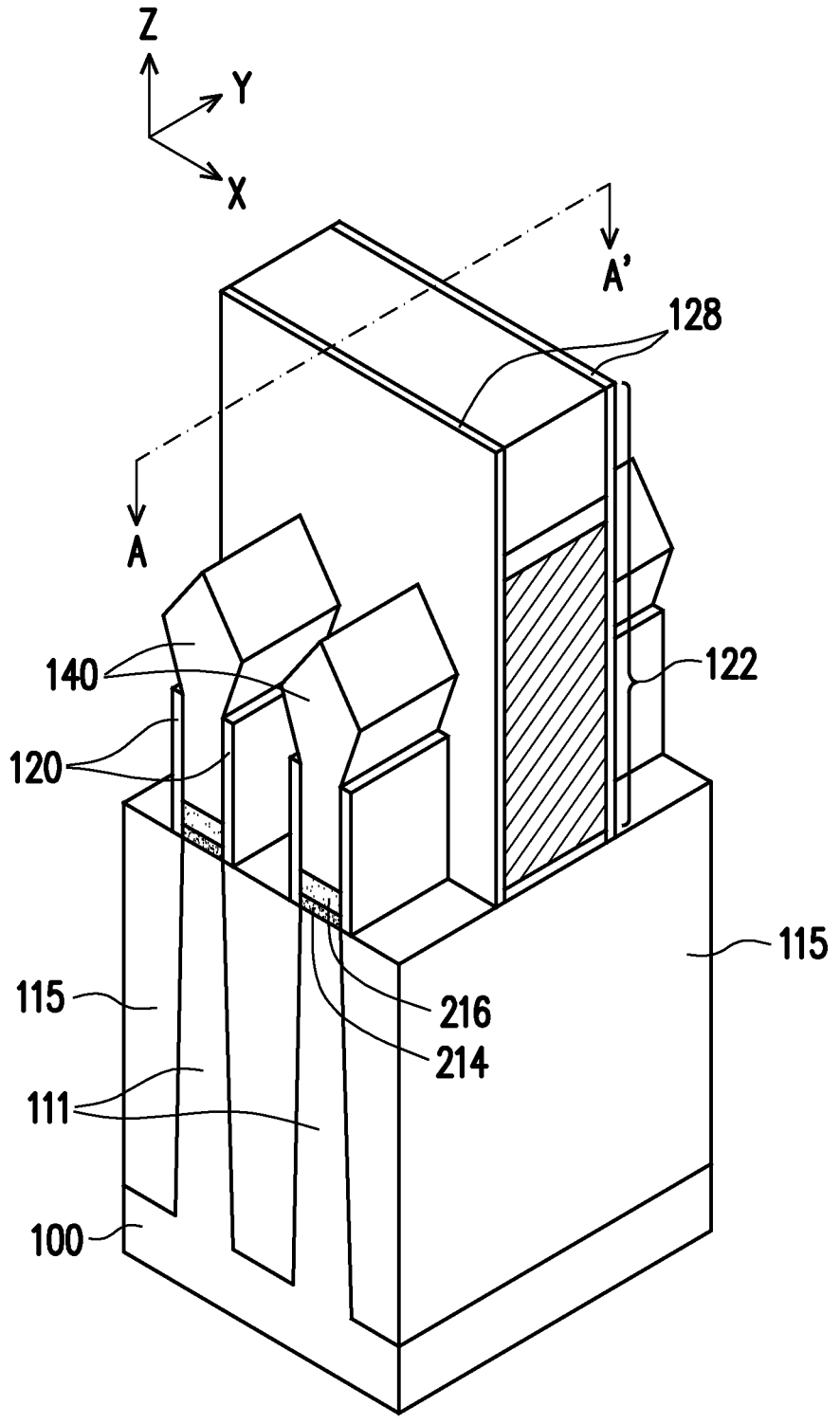

It should be noted that, after forming the S/D recesses 12, a plurality of inner spacers 132 may be formed before forming source/drain (S/D) regions 140 (as shown in FIG. 8). For clarity, the forming steps are shown in FIG. 14 to FIG. 18 which correspond fragmentary cross-sectional views of a semiconductor device in FIG. 7 to FIG. 8 taken along the line A-A'.

Figure 14:
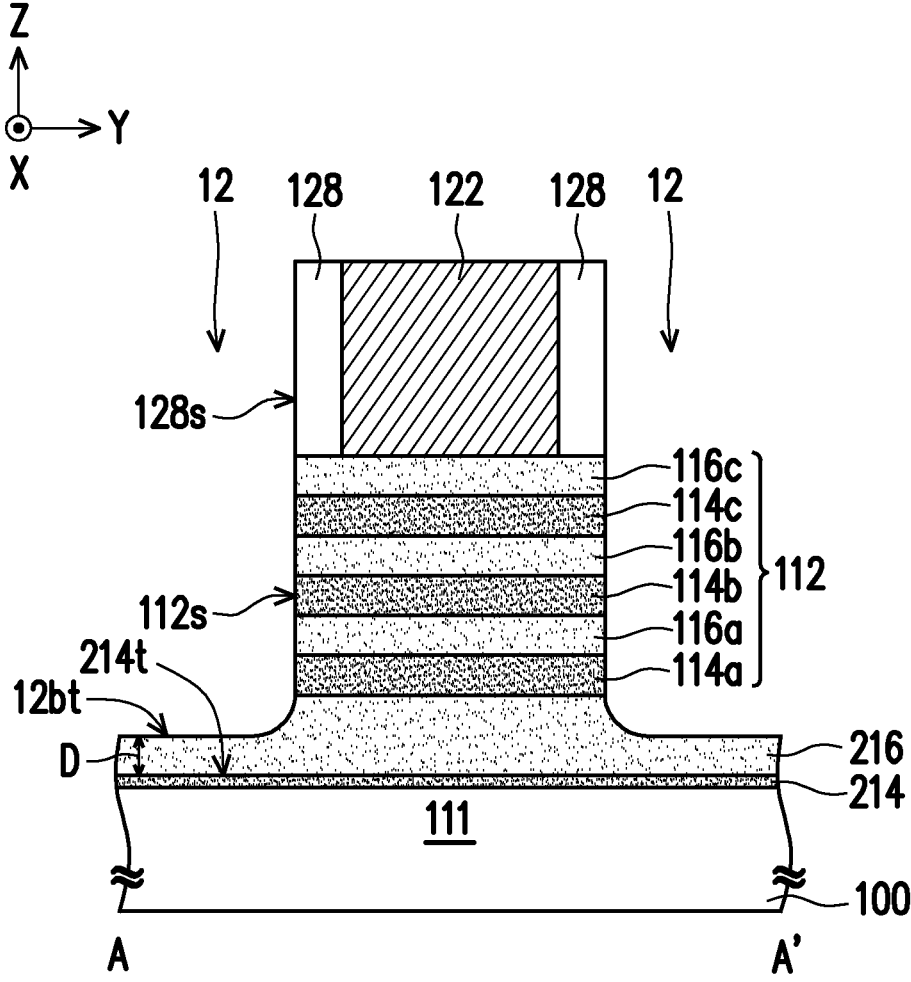
FIG. 14 to FIG. 18 are corresponding fragmentary cross-sectional views of a semiconductor device in FIG. 7 to FIG. 8 taken along the line A-A' in accordance with some embodiments of the disclosure.

Referring to FIG. 14, after forming the S/D recesses 12, a sidewall 112s of the he nanosheet stacks 112 may be aligned with an outer sidewall 128s of the spacers 128. For clarity, the dummy gate stack 122 in the following cross-sectional views are illustrated as a single layer.

Figure 15:
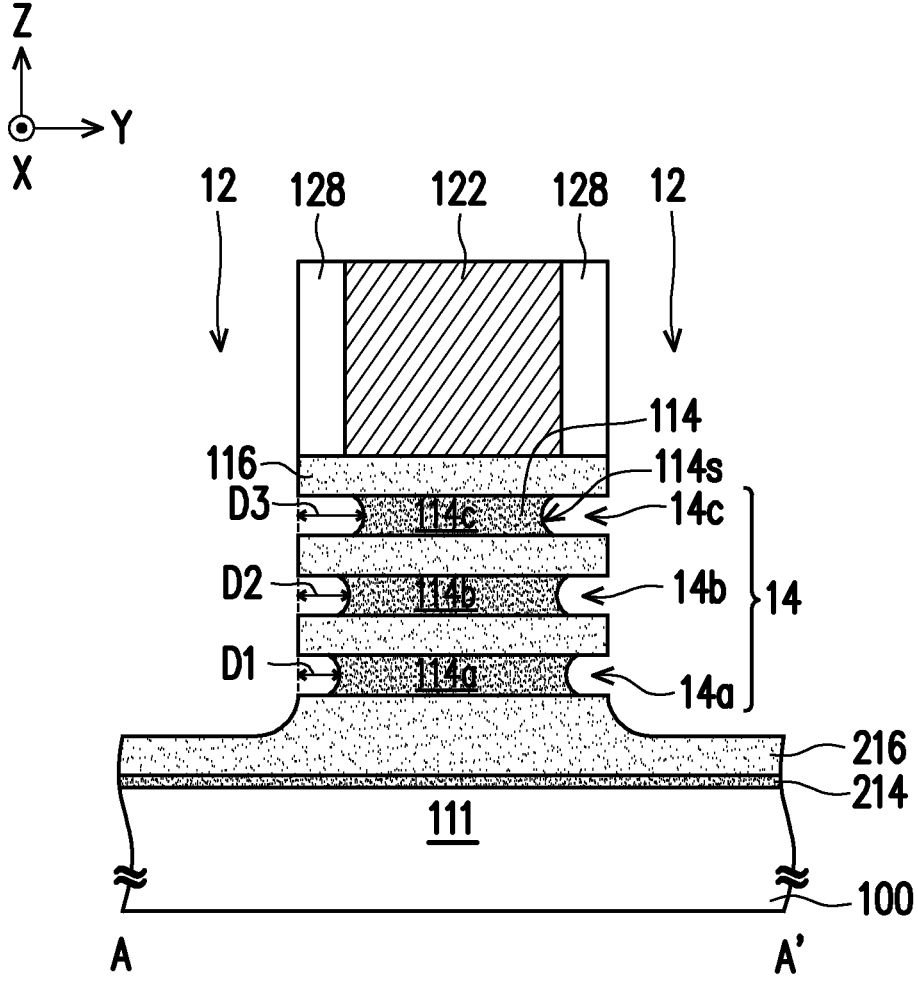

Referring to FIG. 14 and FIG. 15, portions of the first nanosheets 114 are laterally recessed. In some embodiments, the portions of the first nanosheets 114 exposed by the S/D recesses 12 are removed, and thus as shown in FIG. 15, a plurality of cavities 14a, 14b, and 14c (collectively referred to as "cavities 14") are respectively formed between the second nanosheets 116. In some embodiments, the first nanosheets 114 are laterally recessed by a wet etching, a dry etching, or a combination thereof. For example, the first nanosheets 114 may be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. Alternatively, before laterally recessing the portions of the first nanosheets 114, the end portions of the first nanosheets 114 exposed by the recesses 12 may be selectively oxidize, so as to increase the etching selectivity between the first and second nanosheets 114 and 116. In some alternative embodiments, the oxidation process may be performed by exposing to a wet oxidation process, a dry oxidation process, or a combination thereof. The chemical used in the oxidation process may include H$_2$SO$_4$ or the like.

In some embodiments, as shown in FIG. 15, the cavities 14a, 14b, and 14c have different (lateral) depths D1, D2, and D3. In the case, the uppermost first nanosheet 114c is in contact with the etchant for a longer time than the underlying first nanosheet 114a, and thus a removal amount of the uppermost first nanosheet 114c is greater than a removal amount of the underlying first nanosheet 114b. Similarly, the removal amount of the first nanosheet 114b is greater than a removal amount of the underlying first nanosheet 114a. Accordingly, as shown in FIG. 15, the cavity 14c has the depth D3 greater than the depth D2 of the cavity 14b, and the cavity 14a has the depth D1 less than the depth D2 of the cavity 14b. That is, the depths D1, D2, and D3 gradually increase from bottom to top, namely, D1<D2<D3. In some embodiments, the sidewalls 114s of the first nanosheets 114 are not aligned with each other. The depth D1 may be in a range from about 5 nm to about 15 nm, the depth D2 may be in a range from about 6 nm to about 16 nm, the depth D3 may be in a range from about 7 nm to about 17 nm. The sidewalls 114s of the first nanosheets 114 illustrated in FIG. 15 are curved or arc sidewalls protruding from the end of the first nanosheets 114 into the center of the first nanosheets 114. However, the embodiments of the present disclosure are not limited thereto. In other embodiments, the sidewalls of the first nanosheets 114 are vertical sidewalls substantially perpendicular to the top surface of the substrate 100. In some alternative embodiments, the cavities 14a, 14b, and 14c have the same (lateral) depth, namely D1=D2=D3.

Figure 16:
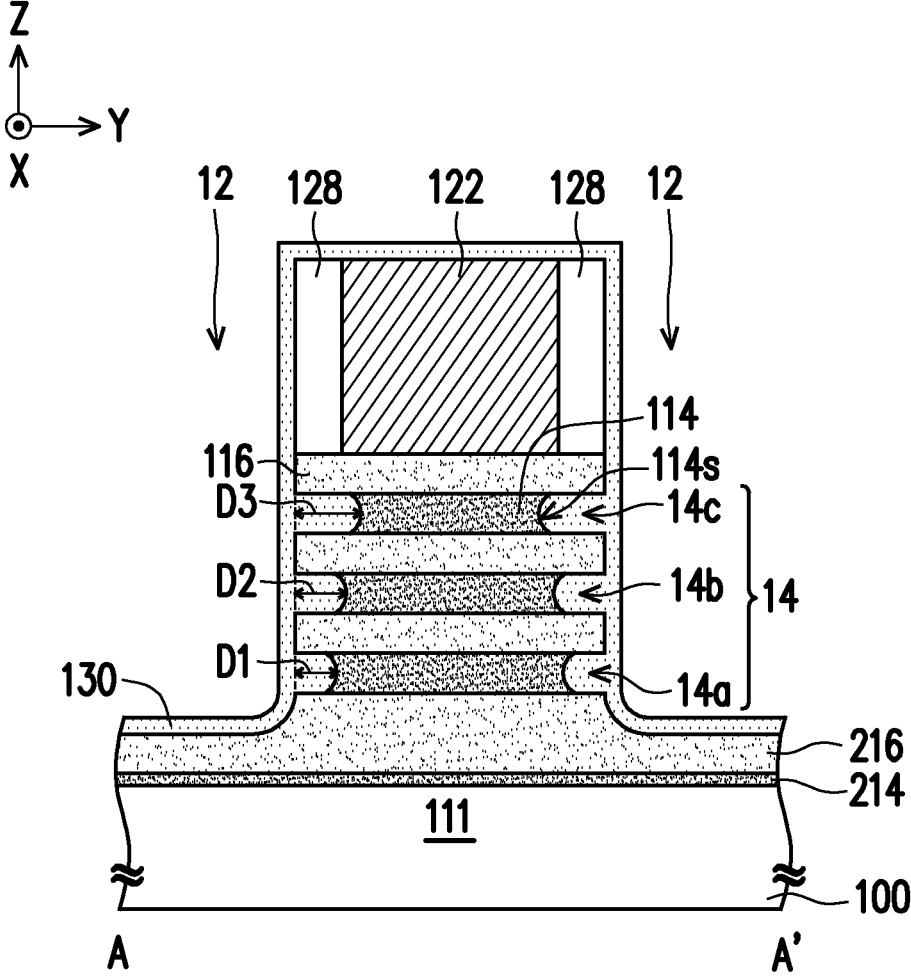

Referring to FIG. 15 and FIG. 16, an inner spacer material layer 130 is formed on the substrate 100. In some embodiments, the inner spacer material layer 130 conformally covers the S/D recesses 12, the dummy gate stack 122, and the spacers 128, and further fills in the cavities 14 (including cavities 14a-14c) to reduce the size of the cavities 14 or completely fill in the cavities 14. In some embodiments, the inner spacer material layer 130 includes silicon oxides, silicon nitrides, silicon carbides, silicon carbide nitride, silicon oxide carbide, silicon carbide oxynitride, and/or other suitable dielectric materials, and may be formed by ALD or any other suitable method. In some alternative embodiments, the inner spacer material layer 130 include a low-k dielectric material having a dielectric constant lower than 3.9.

Figure 17:
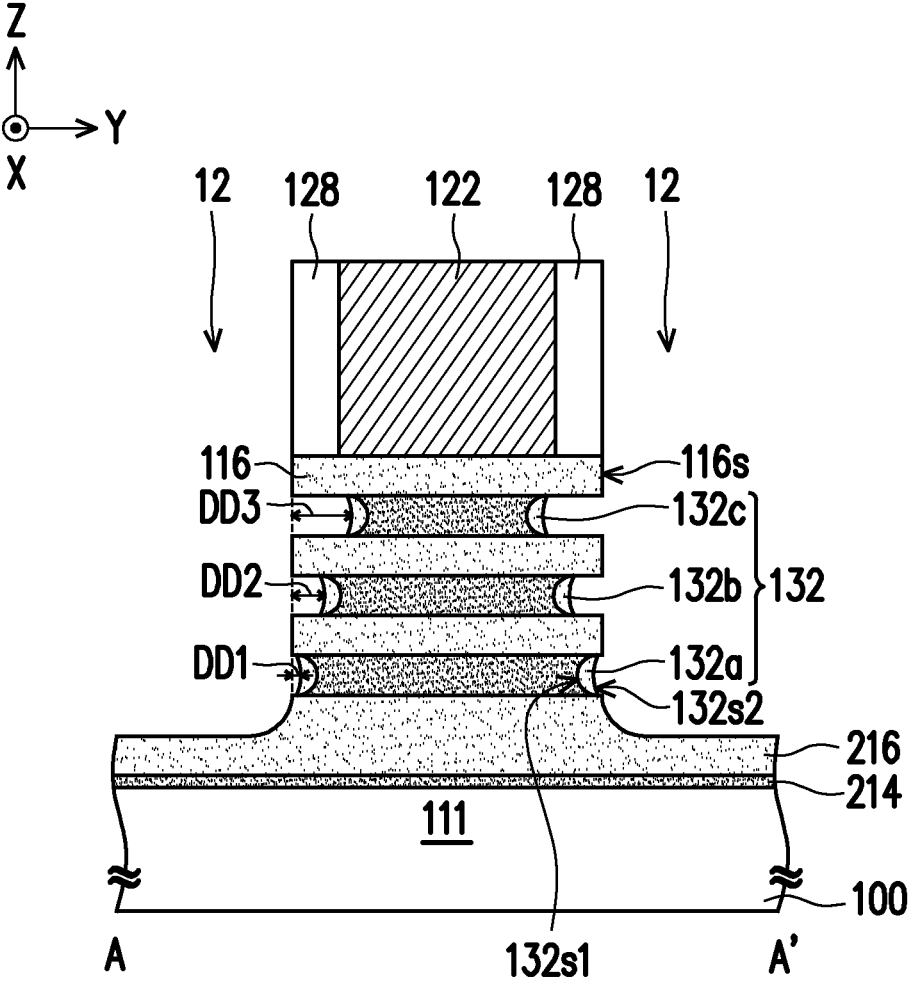

Referring to FIG. 16 and FIG. 17, a portion of the inner spacer material layer 130 is removed to form a plurality of inner spacers 132a, 132b, and 132c (collectively referred to as "inner spacers 132") respectively in the cavities 14a, 14b, and 14c. In some embodiments, the portion of the inner spacer material layer 130 is removed by a plasma dry etching or any other suitable method. Generally, the plasma dry etching etches a layer in wide and flat areas faster than a layer in concave (e.g., holes, grooves and/or slits) portions. Thus, the inner spacer material layer 130 may remain inside the cavities 14. The remaining portions of the inner spacer material layer 130 is referred to as the inner spacers 132. In some embodiments, as shown in FIG. 17, the inner spacers 132 may be formed as crescent shape. That is, one of the inner spacers 132 has a curved inner sidewall 132s1 and a curved outer sidewall 132s2. The outer sidewalls 132s2 are dented or concave from the sidewalls 116s of the second nanosheets 116. In some embodiments, one of the inner spacers 132 may have a center thickness and an edge thickness less than the center thickness. In addition, the dented distances DD1, DD2, and DD3 may gradually increase along a direction from the substrate 100 to the dummy gate stack 122, namely, DD1<DD2<DD3. However, the embodiments of the present disclosure are not limited thereto, in other embodiments, the dented distances DD1, DD2, and DD3 may be the same, namely, DD1=DD2=DD3. Alternatively, the dented distances DD1, DD2, and DD3 may be equal to zero, namely, the inner spacers 132 have the outer sidewalls (not shown) aligned with the sidewalls 116s of the second nanosheets 116. In this case, the inner spacers 132 may be formed as rectangle shape and have the outer sidewalls substantially perpendicular to the top surface of the substrate 100. That is, the inner spacer material 130 on the sidewalls (FIG. 16) is etched and the inner spacer material 130 filled in the cavities 14 are not etched during the said plasma dry etching.

Figure 18:
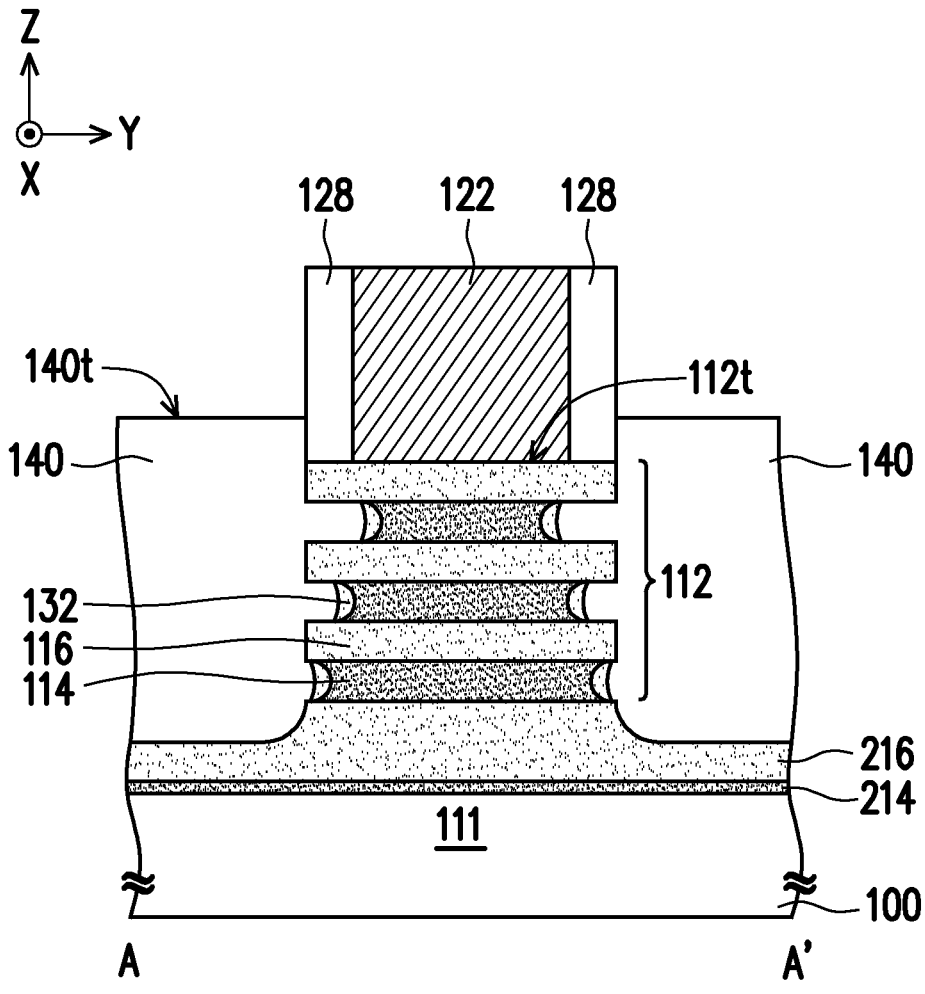

Referring to FIG. 17 and FIG. 18, a strained material 140 (or a highly doped low resistance material) are epitaxially grown from the buffer layer 216. FIG. 18 is the corresponding fragmentary cross-sectional view of FIG. 8 taken along the line A-A'. In some embodiments, the strained material 140 is used to strain or stress the second nanosheets (which may be referred to as channel members) 116 and the fins 111. Herein, the strained material 140 may be referred to as S/D regions 140. In the case, the strained material 140 includes a source disposed at one side of the dummy gate stack 122 and a drain disposed at another side of the dummy gate stack 122. The source covers an end of the fins 111, and the drain covers another end of the fins 111. The S/D regions 140 are abutted and connected to the second nanosheets 116, while the S/D regions 140 are electrically isolated from the first nanosheets 114 by the inner spacers 132. In some embodiments, as shown in FIG. 18, the S/D regions 140 extends beyond the top surface 112t of the nanosheet stacks 112. However, the embodiments of the present disclosure are not limited thereto, in other embodiments, the top surface 140t of the S/D regions 140 is substantially aligned with the top surface 112t of the nanosheet stacks 112.

In some embodiments, the S/D regions 140 is derived from the material of the buffer layer 216. For example, when the buffer layer 216 is polysilicon layer, the strained material 140 may be a silicon-containing material. In some other embodiments, the S/D regions 140 include any acceptable material, such as appropriate for p-type FinFETs. For example, if the liner layer 134 is silicon, the S/D regions 140 may include SiGe, SiGeB, Ge, GeSn, or the like. In some alternative embodiments, the S/D regions 140 includes any acceptable material, such as appropriate for n-type FinFETs. For example, if the liner layer 134 is silicon, the S/D regions 140 may include silicon, SiC, SiCP, SiP, or the like. In some embodiments, the S/D regions 140 are formed by MOCVD, MBE, ALD, or the like.

In some embodiments, the S/D regions 140 may be doped with a conductive dopant. For example, the S/D regions 140, such as SiGe, may be epitaxial-grown with a p-type dopant for straining a p-type FinFET. That is, the S/D regions 140 is doped with the p-type dopant to be the source and the drain of the p-type FinFET. The p-type dopant includes boron or $BF_2$, and the S/D regions 140 may be epitaxial-grown by LPCVD process with in-situ doping. In some alternative embodiments, the S/D regions 140, such as SiC, SiP, a combination of SiC/SiP, or SiCP is epitaxial-grown with an n-type dopant for straining an n-type FinFET. That is, the S/D regions 140 is doped with the n-type dopant to be the source and the drain of the n-type FinFET. The n-type dopant includes arsenic and/or phosphorus, and the S/D regions 140 may be epitaxial-grown by LPCVD process with in-situ doping.

As a result of the epitaxial-grown process used to form the S/D regions 140, the cross section of the S/D regions 140 may have a diamond or pentagonal shape as illustrated in FIG. 8. However, the embodiments of the present disclosure are not limited thereto. In other embodiments, the cross section of the S/D regions 140 also have a hexagonal shape, a pillar shape, or a bar shape. In some embodiments, as shown in FIG. 8, adjacent S/D regions 140 are separated from each other after the epitaxial-grown process is completed. Alternatively, adjacent S/D regions 140 may be merged.

After forming the inner spacers 132 and the S/D regions 140, a releasing nanosheet process is performed by following steps. For clarity, the forming steps are shown in FIG. 19 to FIG. 24 which correspond fragmentary cross-sectional views of the semiconductor device in FIG. 9 to FIG. 13 taken along the line A-A' and the forming steps are also shown in FIG. 26 to FIG. 29 which correspond fragmentary cross-sectional views of the semiconductor device in FIG. 10 to FIG. 13 taken along the line B-B'.

Figure 9:
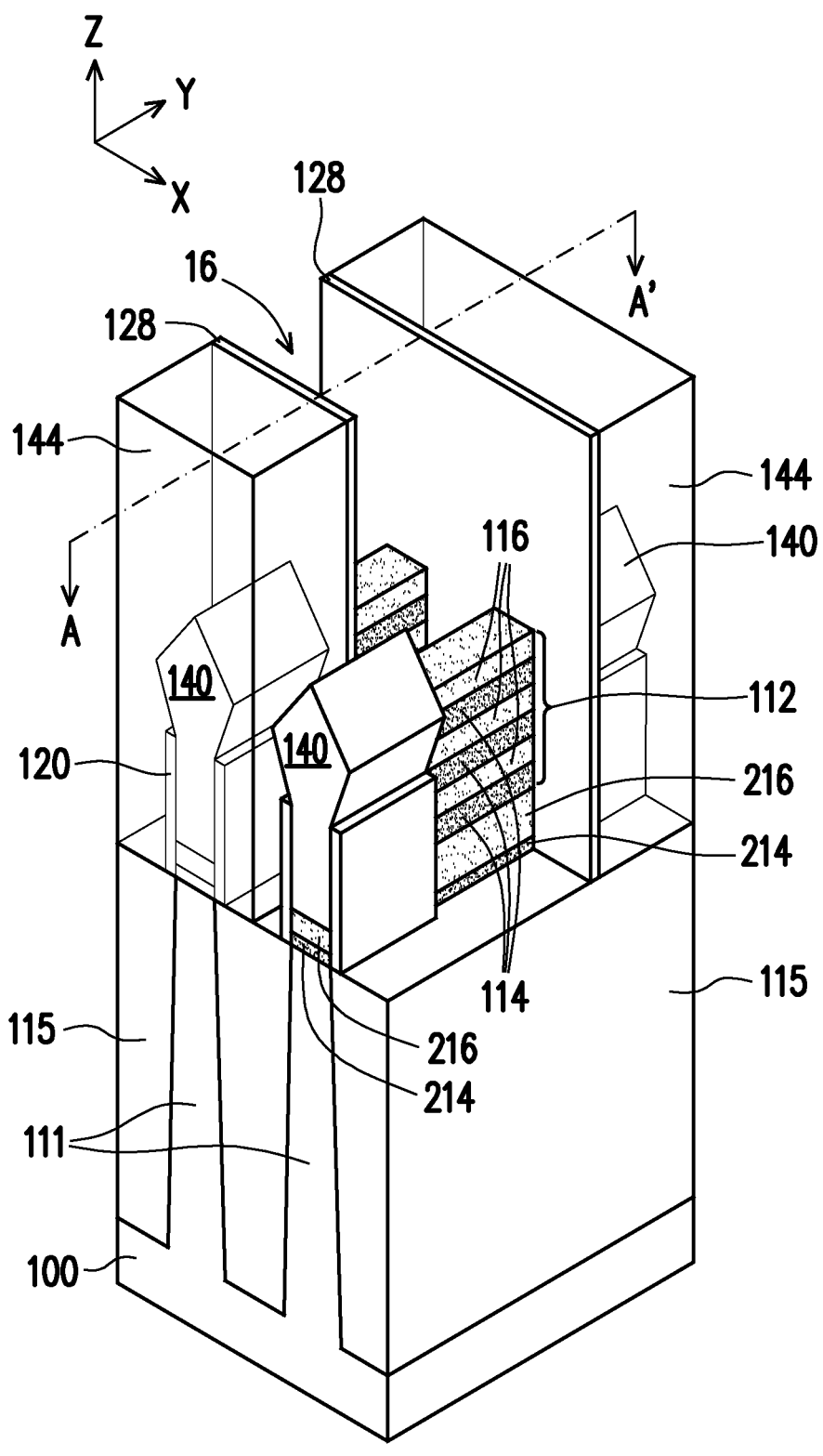
Figure 19:
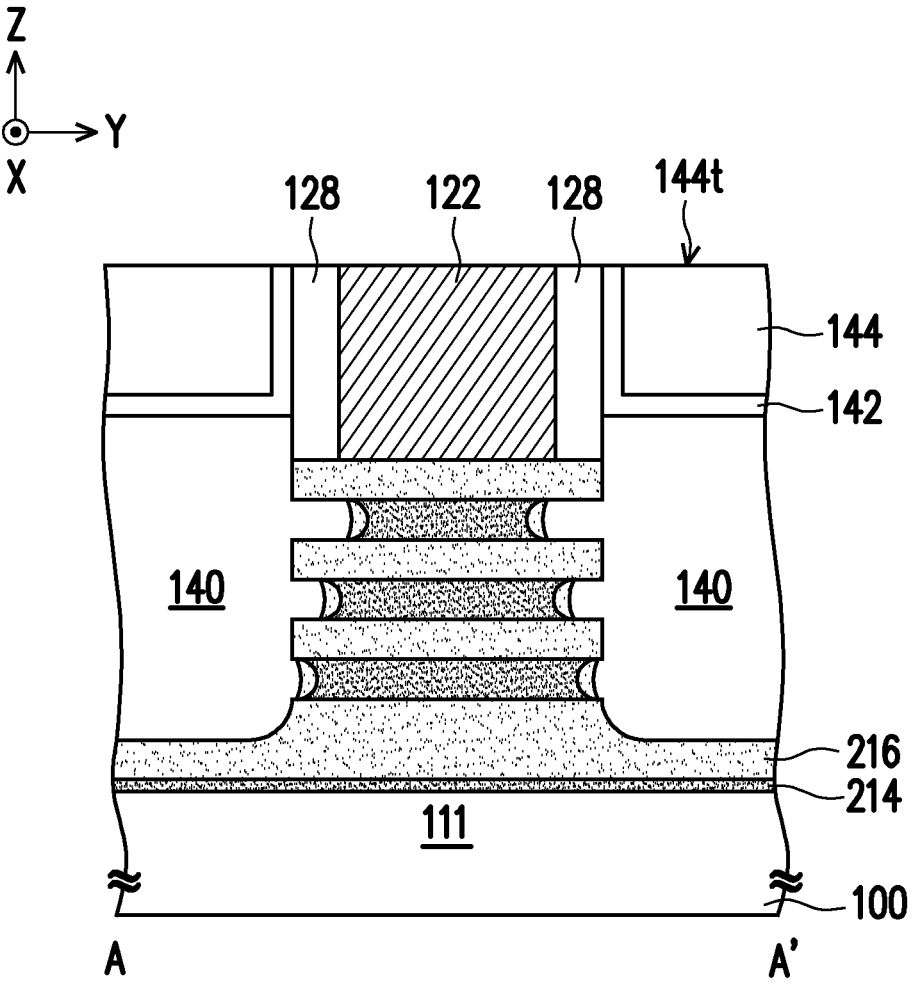
FIG. 19 to FIG. 24 are corresponding fragmentary cross-sectional views of a semiconductor device in FIG. 9 to FIG. 13 taken along the line A-A' in accordance with some embodiments of the disclosure.

Referring to FIG. 9 and FIG. 19, a contact etch stop layer (CESL) 142 over the S/D regions 140 and an interlayer dielectric (ILD) layer 144 over the CESL 142. In some embodiments, the CESL 142 conformally covers the S/D regions 140 and the sidewalls of the outer sidewall 128s of the spacers 128. For clarity, the CESL 142 is not illustrated in perspective views of FIG. 9. The CESL 142 may include silicon nitride, silicon oxynitride, silicon nitride with oxygen (O) or carbon (C) elements, and/or other materials; and may be formed by CVD, PVD (physical vapor deposition), ALD, or other suitable methods.

In addition, in order to illustrate the features behind the front portion of the ILD layer 144, some front portions of the ILD layer 144 are not shown in FIG. 9 and subsequent figures, so that the inner features may be illustrated. It is appreciated that the un-illustrated portions of the ILD layer 144 still exist. In some embodiments, the ILD layer 144 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 144 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzo-cyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 144 include one or more dielectric materials and/or one or more dielectric layers. In some embodiments, the ILD layer 144 is formed to a suitable thickness by FCVD, HDPCVD, SACVD, spin-on, sputtering, or other suitable methods. For example, an interlayer dielectric material layer (not shown) is initially formed to cover the isolation regions 115, the dummy gate stack 122, and the spacers 128. Subsequently, a thickness of the interlayer dielectric material layer is reduced until the dummy gate stack 122 is exposed, so as to form the ILD layer 144. The process of reducing the thickness of the interlayer dielectric material layer may be achieved by a CMP process, an etching process, or other suitable processes. In the case, the top surface 144t of the ILD layer 144 may be coplanar with the top surface 122t of the dummy gate stack 122.

Figure 20:
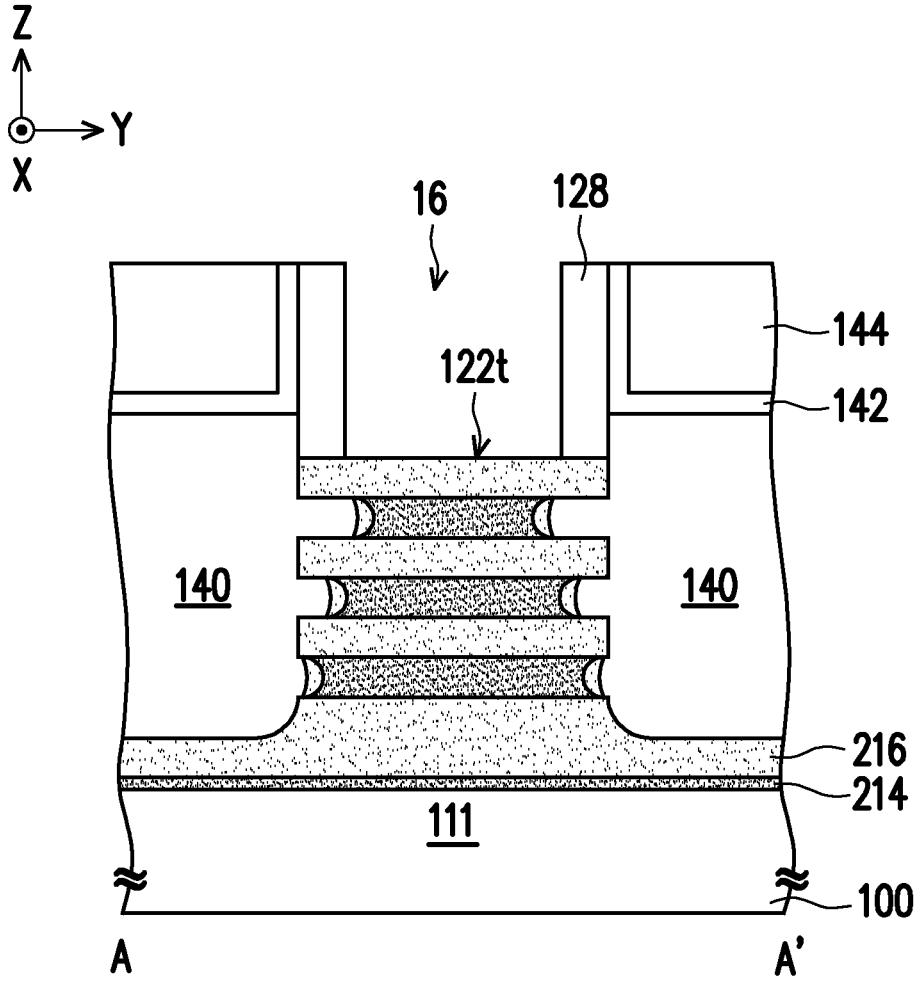

Referring to FIG. 9 and FIG. 20, the dummy gate stack 122 is removed to form a gate trench 16. The ILD layer 144 and the CESL 142 may protect the S/D regions 140 during removing the dummy gate stack 122. As shown in FIG. 9, the nanosheet stacks 112, the buffer layers 216, and the bottom semiconductor layers 214 are exposed the gate trench 16. In some embodiments, the dummy gate stack 122 may be removed by using plasma dry etching and/or wet etching. When the dummy gate electrode is polysilicon and the ILD layer 144 is silicon oxide, a wet etchant such as a TMAH solution may be used to selectively remove the dummy gate electrode. The dummy gate dielectric layer is thereafter removed by using another plasma dry etching and/or wet etching.

Figure 10:
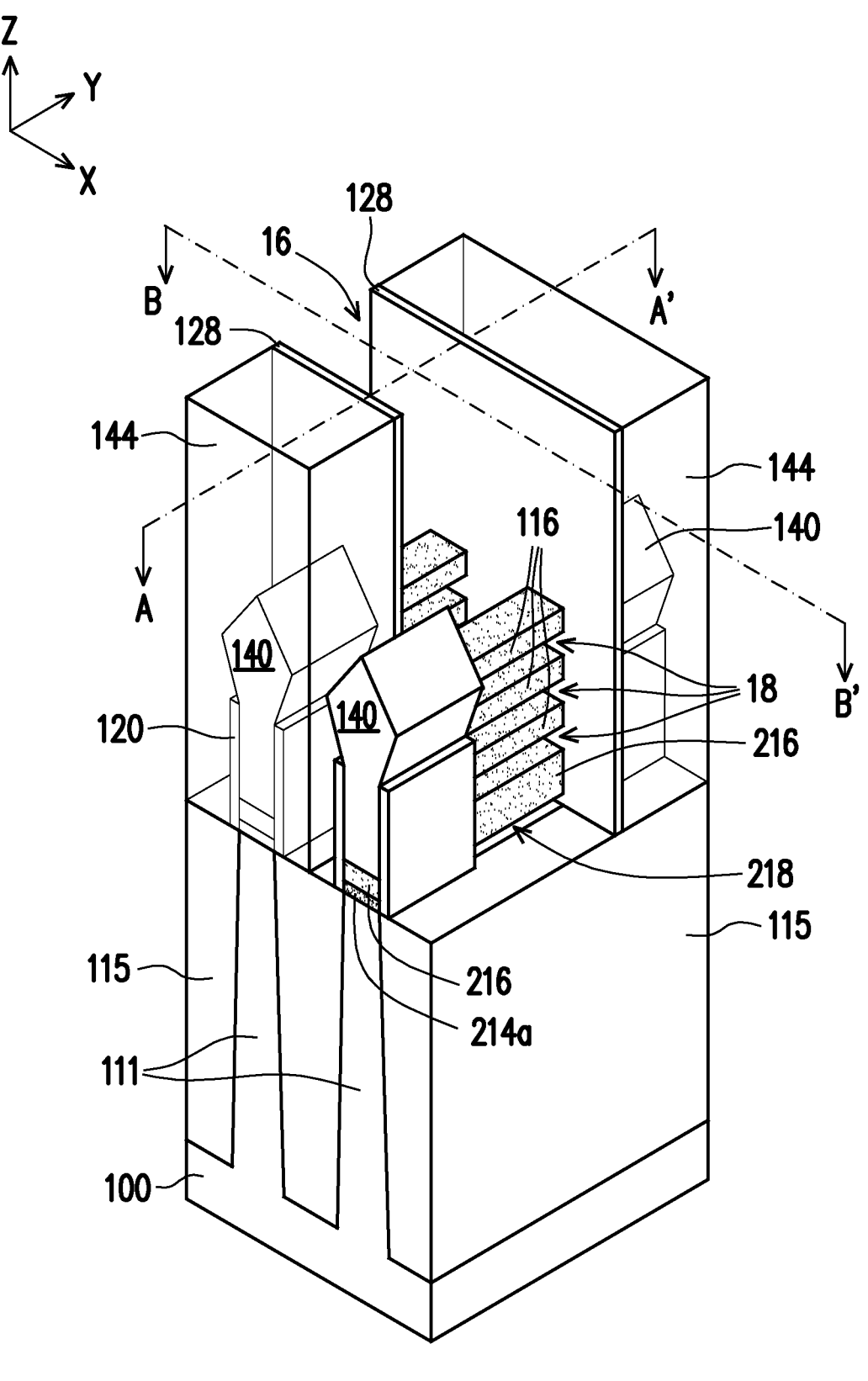
Figure 21:
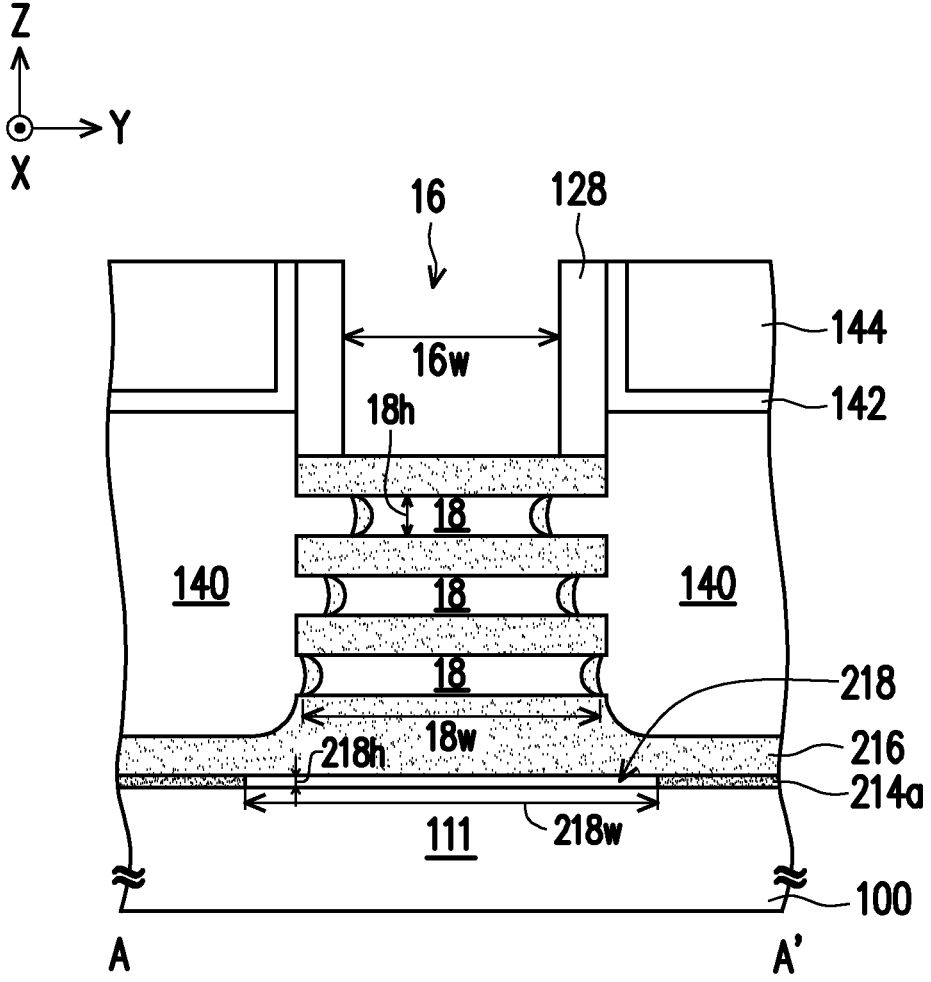
Figure 25:
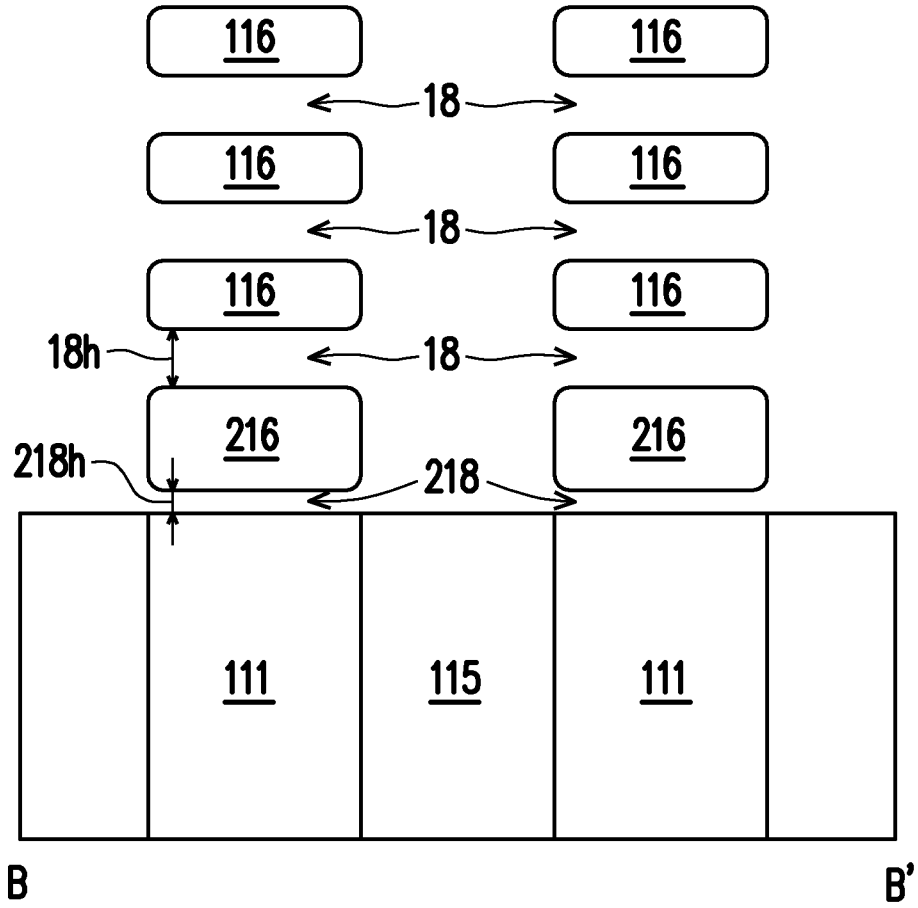
FIG. 25 to FIG. 28 are corresponding fragmentary cross-sectional views of a semiconductor device in FIG. 10 to FIG. 13 taken along the line B-B' in accordance with some embodiments of the disclosure.
Figure 26:
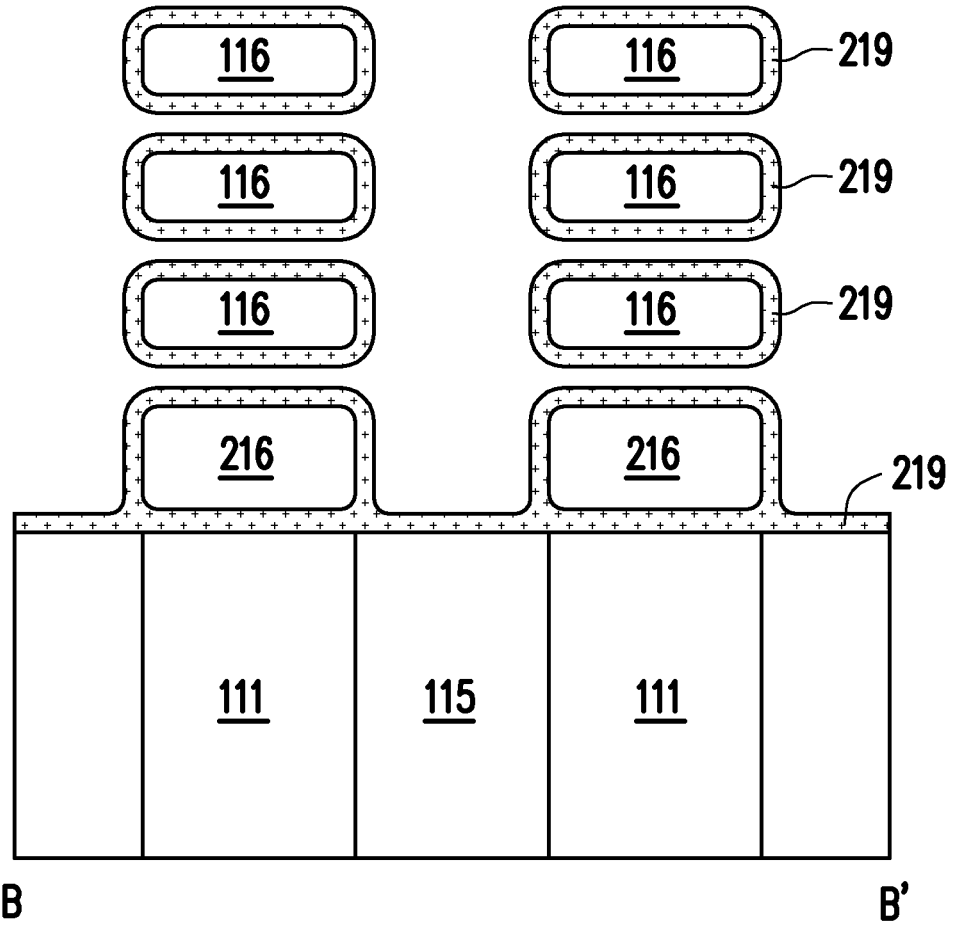

Referring to FIG. 10, FIG. 21, and FIG. 25, a first etching process is performed to remove the first nanosheets 114 and a portion of the bottom semiconductor layers 214. In the case, the first nanosheets 114 may be completely removed to form a plurality of gaps 18 (which may be referred to as second gaps) between the second nanosheets 116. Accordingly, the second nanosheets 116 are separated from each other by the gaps 18. In other words, as shown in FIG. 25, the second nanosheets 116 are suspended. The opposite ends of the suspended second nanosheets 116 are connected to S/D regions 140, as shown in FIG. 10. Herein, the suspended second nanosheets 116 may be referred to as channel members 116. It should be noted that the inner spacers 132 may be referred to as a barrier for protecting the S/D regions 140 from damaging during the first etching process. Herein, the etching process may be referred to as nanosheet formation or releasing nanosheet process. Although the channel members 116 in cross-section illustrated in FIG. 26 are rectangle-like shape (which has rounded corners, a flat top surface connecting two adjacent rounded corners, and a flat bottom surface connecting other adjacent rounded corners), the embodiment of the disclosure is not limited thereto. In some alternative embodiments, the channel members 116 in cross-section may be circular shape, elliptical shape, or the like.

In some embodiments, a height 18h of the gaps 18 may be 5 nm to 30 nm. In the present embodiment, the second nanosheets 116 include silicon, and the first nanosheets 114 include silicon germanium. The first nanosheets 114 may be selectively removed by oxidizing the first nanosheets 114 using a suitable oxidizer, such as ozone. Thereafter, the oxidized first nanosheets 114 may be selectively removed from the gate trench 16. In some embodiments, the first etching process includes a dry etching process to selectively remove the first nanosheets 114, for example, by applying an HCl gas at a temperature of about 20° C. to about 300° C., or applying a gas mixture of $CF_4$, $SF_6$, and $CHF_3$. Herein, as shown in FIG. 21, vertically stacked nanosheets 116 may be referred to as semiconductor nanosheet stacks or channel stack of the n-type and/or p-type semiconductor device, alternatively.

On the other hand, as shown in FIG. 21, the bottom semiconductor layers 214 may be partially removed in the first etching process to form a gap 218 (which may be referred to as first gap) between the buffer layer 216, a remaining portion of the bottom semiconductor layers 214a, and the fin 111. In the present embodiment, the bottom semiconductor layers 214 and the first nanosheets 114 have the same material, such as silicon germanium. In the case, the bottom semiconductor layers 214 exposed by the gate trench 16 may be selectively removed by oxidizing the bottom semiconductor layers 214 using a suitable oxidizer, such as ozone. Thereafter, the oxidized bottom semiconductor layers 214 may be selectively removed from the gate trench 16. In some embodiments, the semiconductor layers 214 and the first nanosheets 114 have the same etching selectivity in the first etching process. Since the thickness (i.e., T3 in FIG. 1) of the bottom semiconductor layer 214 is thinner than the thickness (i.e., T1 in FIG. 1) of the first nanosheets 114, a lateral removal amount of the bottom semiconductor layer 214 is greater than a lateral removal amount of the first nanosheets 114. Accordingly, the gap 218 may have a width 218w greater than or equal to a width 18w of the gaps 18 or a width 16w of the gate trench 16. In some embodiments, the gap 218 further extends below the S/D regions 140. That is, the gap 218 may be in contact with the remaining portion of the bottom semiconductor layers 214a directly under the S/D regions 140.

Figure 11:
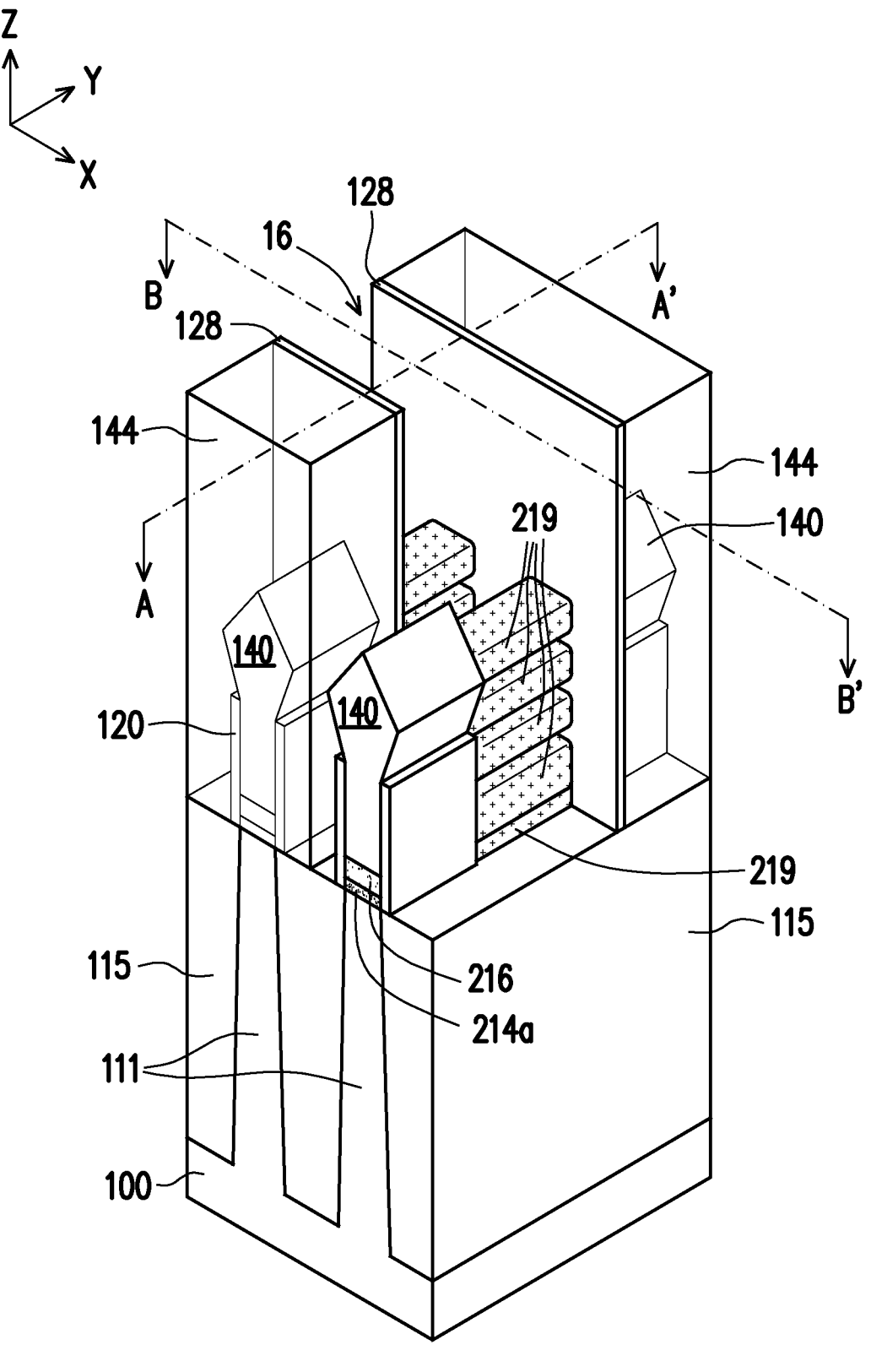
Figure 22:
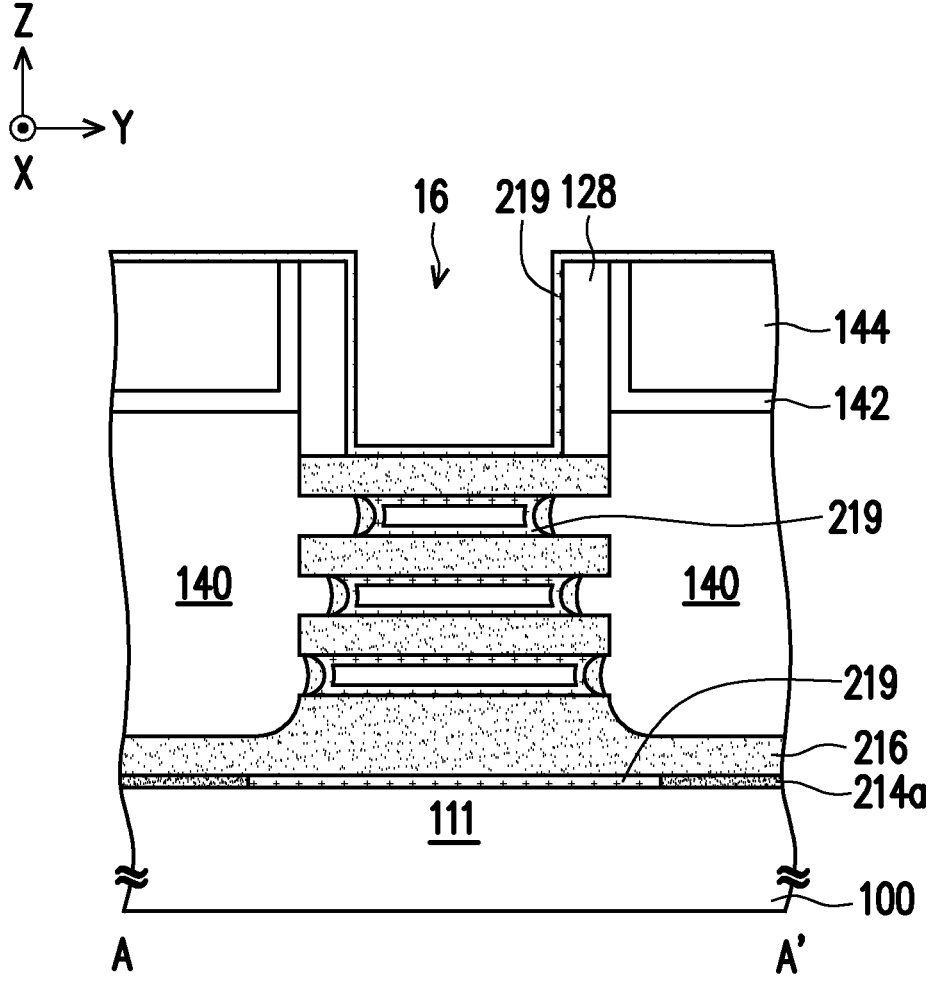

Referring to FIG. 11, FIG. 22, and FIG. 26, a bottom dielectric material 219 is formed to fill in the gate trench 16, the gaps 18, and the gap 218. In some embodiments, the bottom dielectric material 219 include silicon oxide (SiO), silicon nitride (SiN), aluminum oxide (AlO), or a combination thereof, and may be formed by CVD, ALD or any suitable method. As shown in FIG. 22, a portion of the bottom dielectric material 219 may fully fill in the gap 218. As shown in FIG. 11, FIG. 22, and FIG. 26, another portion of the bottom dielectric material 219 may wrap the second nanosheets 116 and conformally cover the gate trench 16 to form a U-shape cross-section. In some embodiments, the bottom dielectric material 219 further covers the top surfaces of the CESL 142 and the ILD layer 144. For clarity, the bottom dielectric material 219 on the sidewalls of the gate trench 16 and on the top surfaces of the CESL 142 and the ILD layer 144 is not illustrated in perspective views of FIG. 11.

Figure 12:
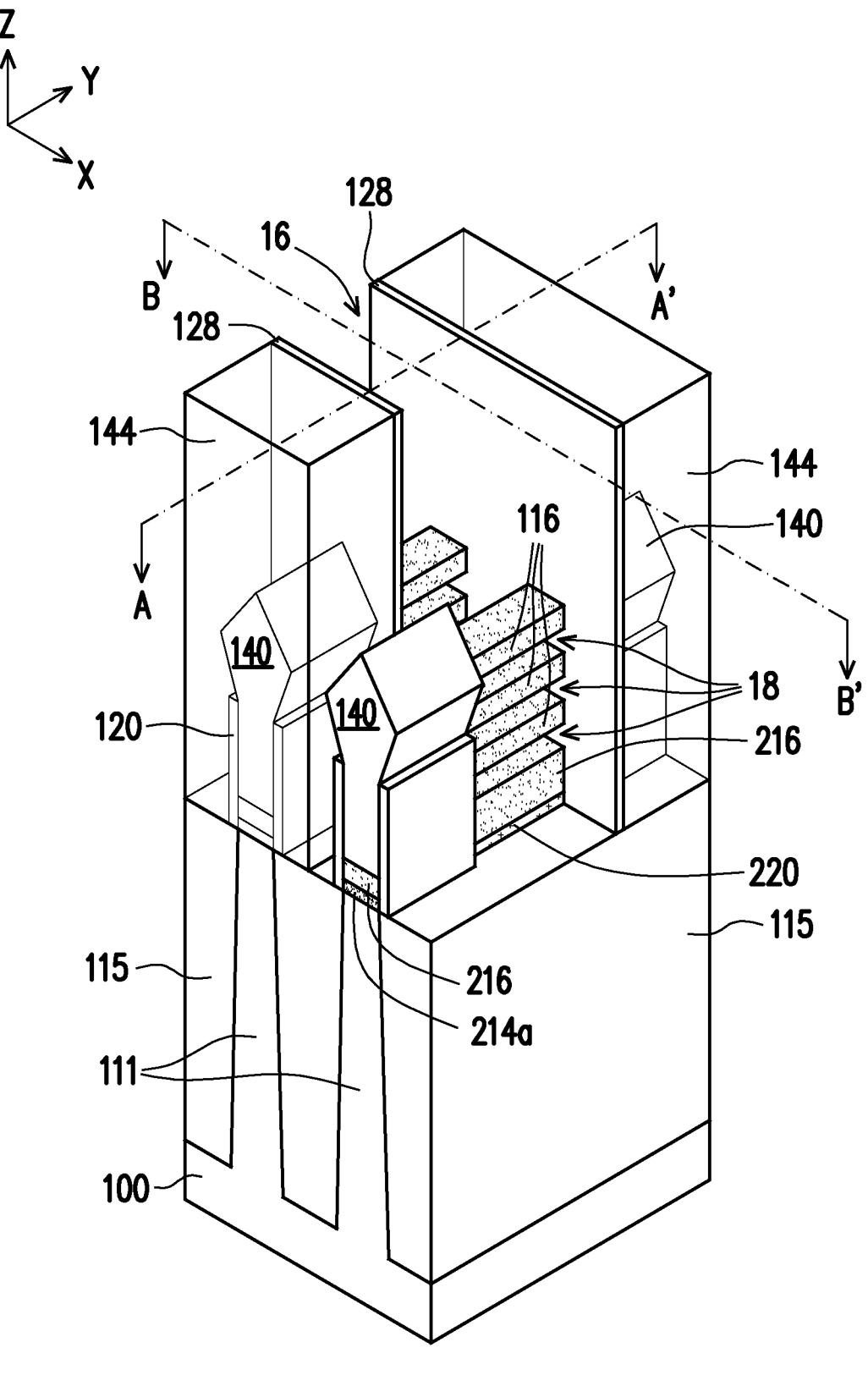
Figure 23:
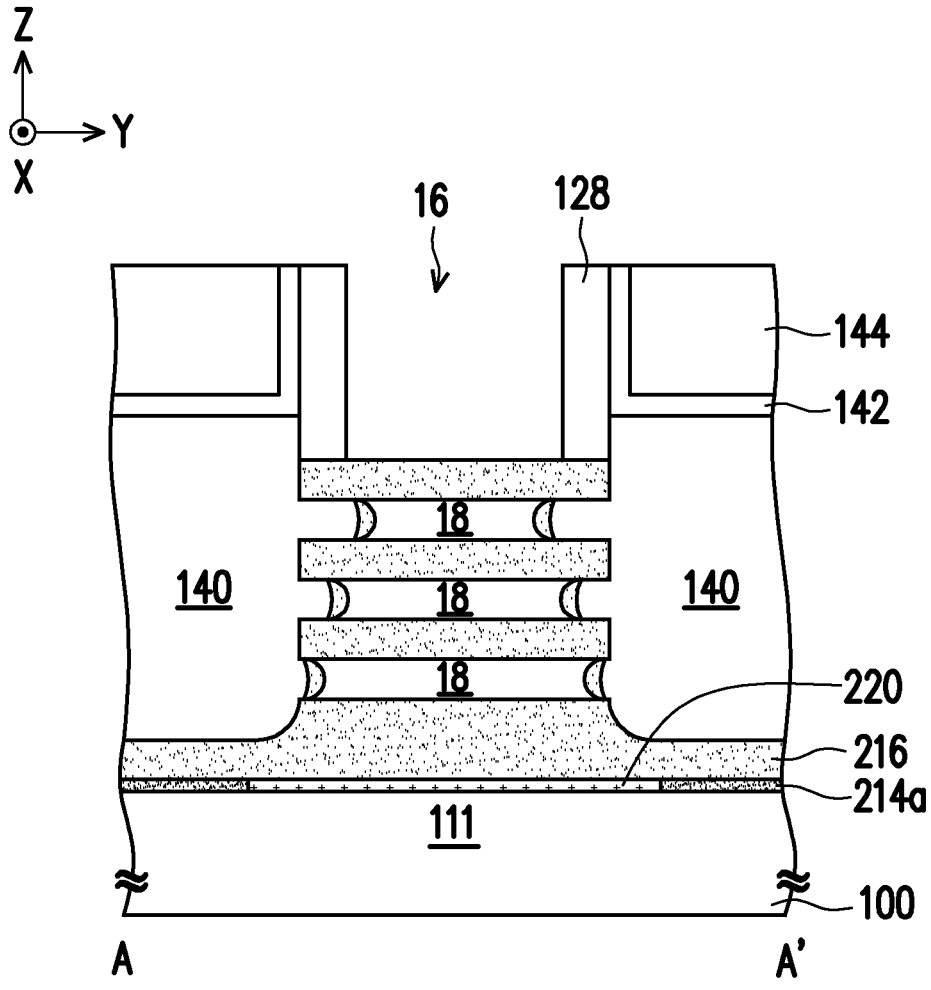
Figure 27:
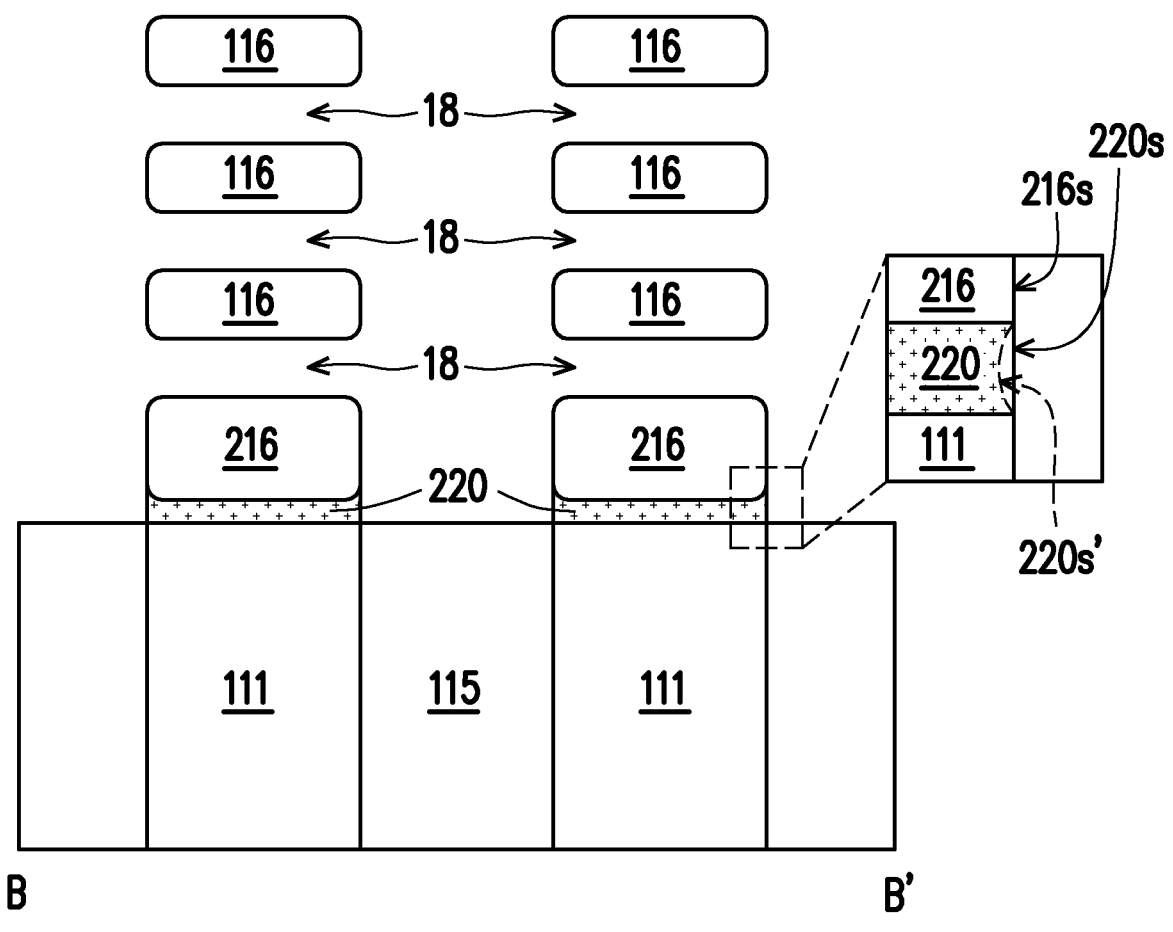

Referring to FIG. 12, FIG. 23, and FIG. 27, a second etching process is performed to remove the bottom dielectric material 219 in the gate trench 16 and the gaps 18. In some embodiments, the bottom dielectric material 219 on the top surfaces of the CESL 142 and the ILD layer 144 is also removed, and a portion of the ILD layer 144 may be consumed during the second etching process. In some embodiments, the second etching process includes a wet etching process, a dry etching process, or a combination thereof. When the bottom dielectric material 219 is $SiO_2$ and the ILD layer 144 is $SiO_2$, a wet etchant such as HF may be used to selectively remove the bottom dielectric material 219. Since the second etching process may etch a material in flat areas and/or great gap faster than a material in small gap (e.g., slits), a remaining portion of the bottom dielectric material 219 may be left in the gap 218 to form a bottom dielectric layer 220, as shown in FIG. 23 and FIG. 27. In the case, the bottom dielectric layer 220 may be sandwiched between the buffer layer 216 and the fin 111. In the present embodiment, the bottom dielectric layer 220 further extend under the S/D regions 140 and may be in contact with the bottom semiconductor layers 214a directly under the S/D regions 140, as shown in FIG. 23. In some alternative embodiments, the second etching process includes an anisotropic etching process, an isotropic etching process, or a combination thereof. Take the anisotropic etching process as example, a sidewall 220s of the bottom dielectric layer 220 may be aligned with a sidewall 216s of the buffer layer 216 as show in FIG. 27. In addition, a sidewall 220s' (drawn as dotted line) of the bottom dielectric layer 220 may be concave from the sidewall 216s of the buffer layer 216 when the second etching process is an isotropic etching process, as show in the enlarged view of FIG. 27. After the second etching process, the second nanosheets 116 may be released again.

Figure 13:
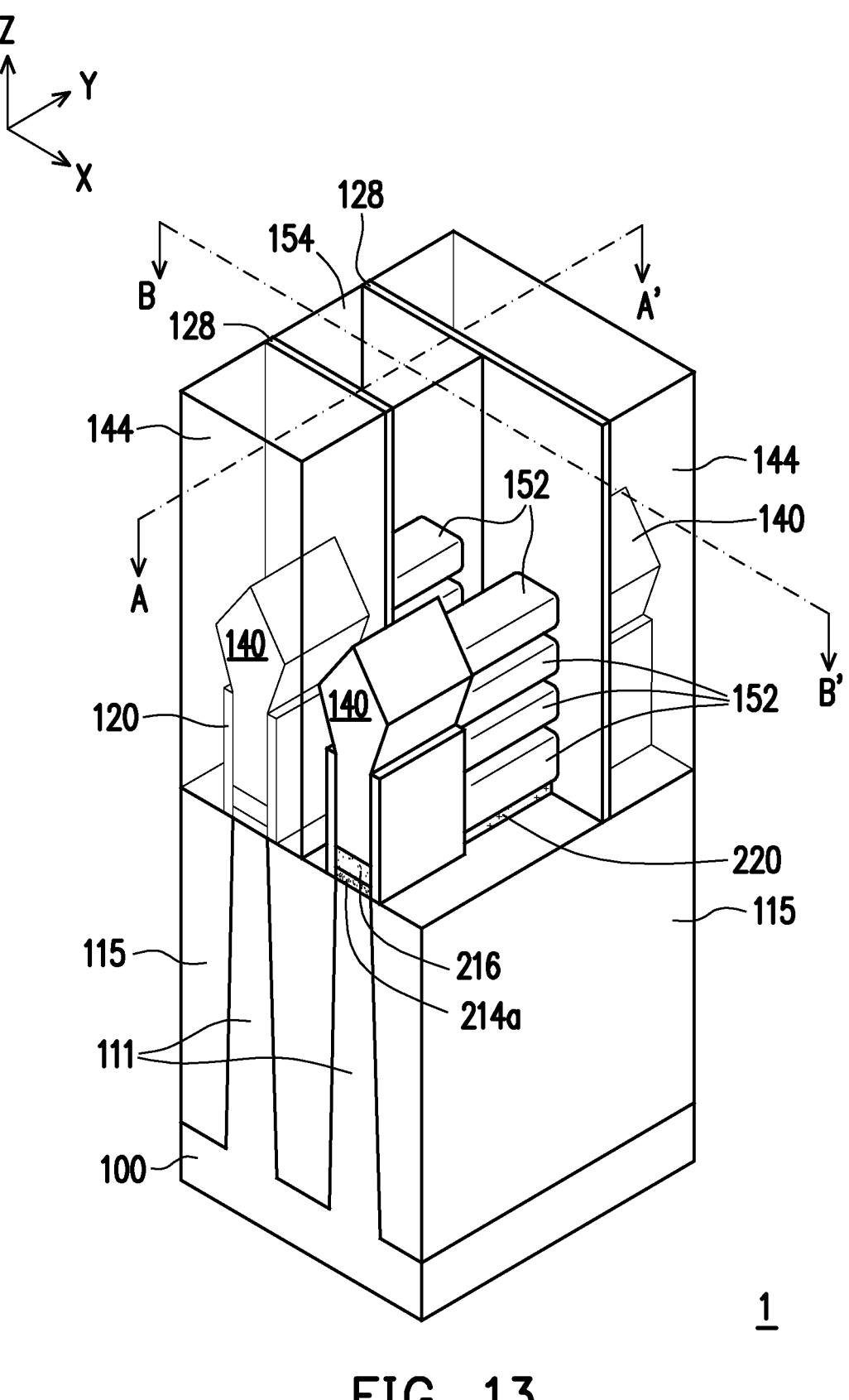
Figure 24:
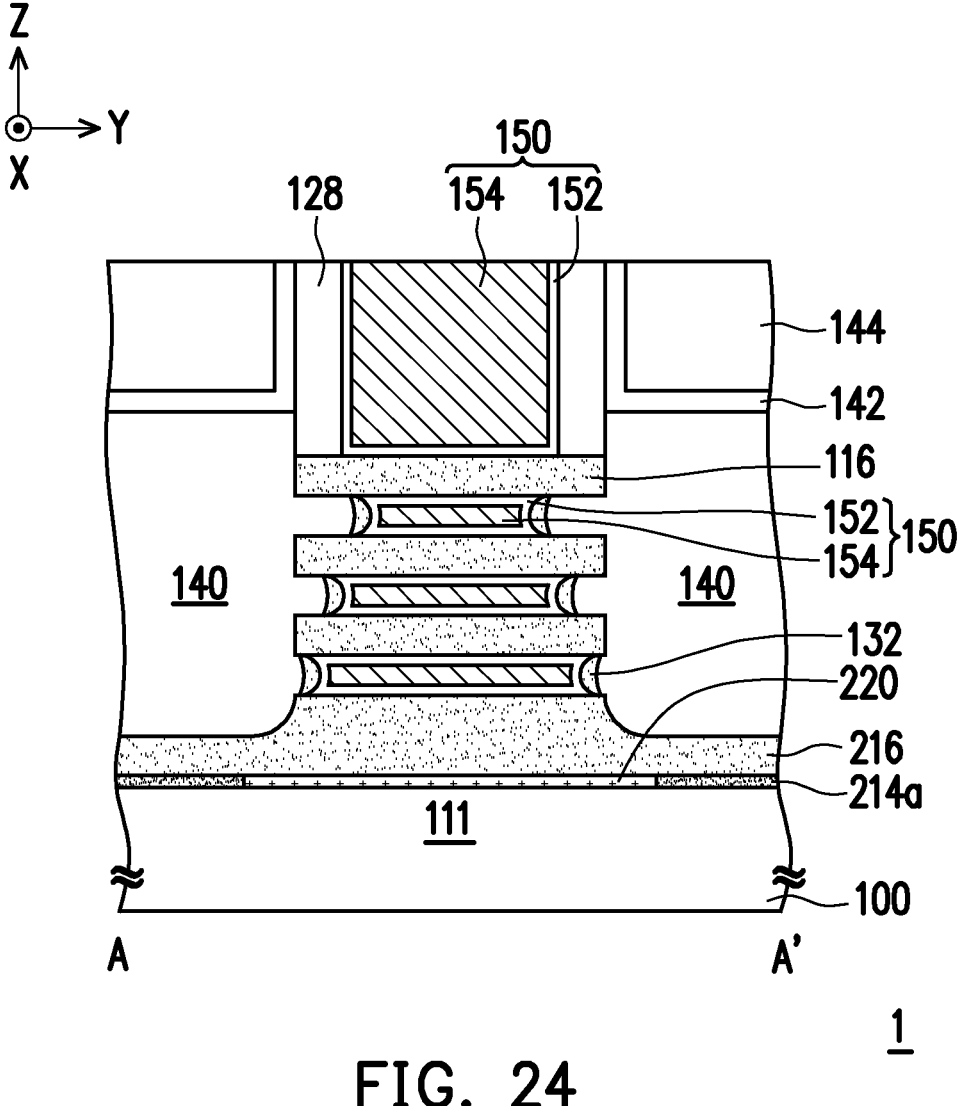
Figure 28:
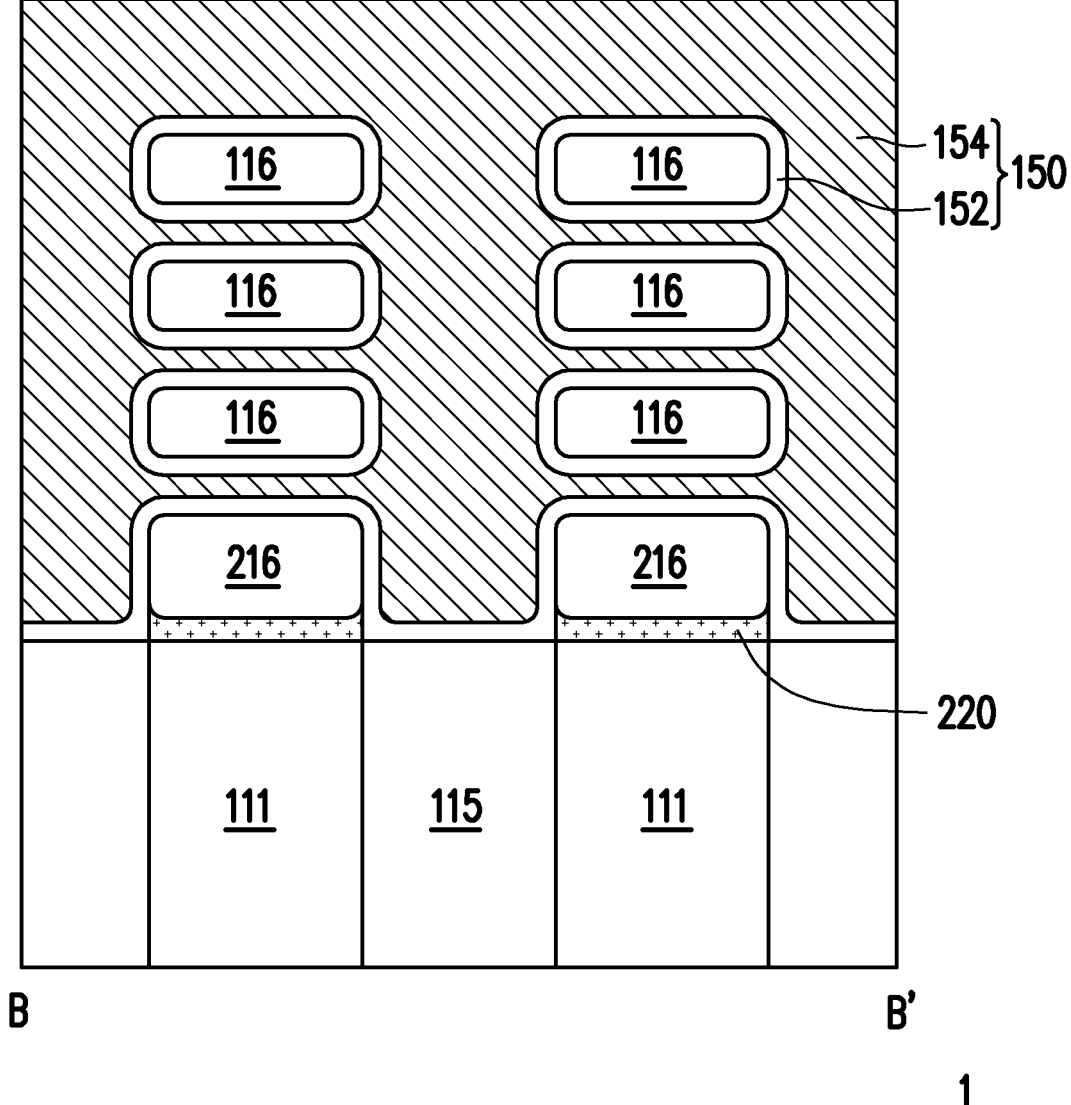

Referring to FIG. 13, FIG. 24, and FIG. 28, a gate dielectric layer 152 is formed in the gate trench 16 and the gaps 18. FIG. 28 illustrates a clearer view of the gate dielectric layer 152 wrapping the second nanosheets 116. In addition, the gate dielectric layer 152 conformally covers the gate trench 16 to form a U-shape cross-section, as shown in FIG. 24. In some embodiments, the gate dielectric layer 152 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 152 includes an interfacial layer (not shown) formed between the channel members and the dielectric material. The gate dielectric layer 152 may be formed by CVD, ALD or any suitable method. In one embodiment, the gate dielectric layer 152 is formed by using a highly conformal deposition process, such as ALD in order to ensure the formation of a gate dielectric layer having a uniform thickness around each channel members. A thickness of the gate dielectric layer 152 is in a range from about 0.5 nm to about 3 nm in some embodiments. Thereafter, a gate electrode 154 is formed on the gate dielectric layer 152 to surround each nanosheet or channel member 116. In the case, the gate electrode 154 and the gate dielectric layer 152 constitute a gate stack 150, and a semiconductor device 1 of the first embodiment is accomplished, as shown in FIG. 13 and FIG. 24.

The gate electrode 154 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 154 may be formed by CVD, ALD, electro-plating, or other suitable method. The gate dielectric layer 152 and the gate electrode 154 may also be deposited over the upper surfaces of the ILD layer 144 and the CESL 142. The gate dielectric layer 152 and the gate electrode 154 formed over the ILD layer 144 and the CESL 142 are then planarized by using, for example, CMP, until the top surfaces of the ILD layer 144 and the CESL 142 are revealed. In some embodiments, after the planarization operation, the gate electrode 154 is recessed and a cap insulating layer (not shown) is formed over the recessed gate electrode 154. The cap insulating layer includes one or more layers of a silicon nitride-based material, such as SiN. The cap insulating layer may be formed by depositing an insulating material followed by a planarization operation.

In some alternative embodiments, one or more work function adjustment layers (not shown) are interposed between the gate dielectric layer 152 and the gate electrode 154. The work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For the n-type device, one or more of TaN, TaAlC, TiN, TiC, Co, TiAl, HfTi, TiSi and TaSi is used as the work function adjustment layer, and for the p-type device, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-type device and the p-type device which may use different metal layers.

Further, although the gate electrode 154 illustrated in FIG. 28 is sandwiched between adjacent channel members 116 to separate the gate dielectric layers 152 from each other. However, the embodiment of the disclosure is not limited thereto, in other embodiments, portions of the gate dielectric layer 154 wrapping the channel members 116 are connected together to form a continuous region. In the case, the gate electrode 154 will not be filled into the gaps between the channel members 116.

It should be noted that the bottom dielectric layer 220 below the gate stack 150 is able to block the punch through leakage current between adjacent S/D regions 140, thereby enhancing the device performance and the reliability. In addition, the bottom dielectric layer 220 may prevent dopants in the substrate 100 (e.g., phosphorous in the n-well and boron in the p-well) from diffusing upwardly into the S/D regions, thereby maintaining the device performance. Furthermore, the said process flow with bottom dielectric layer formation can be easily integrated into existing semiconductor fabrication processes. As shown in FIG. 24, the bottom dielectric layer 220 and the bottom semiconductor layers 214a are at the same level and connected to each other under the S/D regions 140. Herein, when elements are described as "at the same level", the elements are formed at substantially the same height in the same layer, or having the same positions embedded by the same layer. In the present embodiment, the bottom dielectric layer 220 and the bottom semiconductor layers 214a have the same thickness and are both sandwiched between the fin 111 and the buffer layer 216. From another perspective, the bottom dielectric layer 220 and the bottom semiconductor layers 214a may be considered as a whole bottom layer sandwiched between the substrate 100 and the buffer layer 216.

Figure 29:
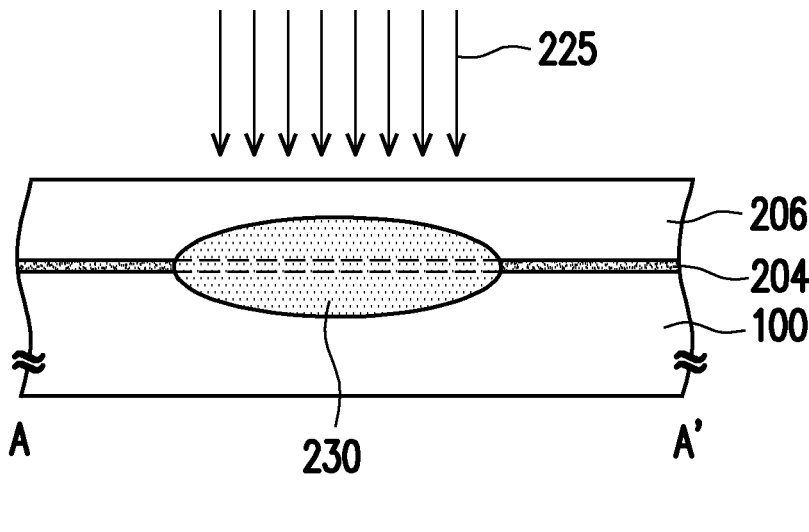
FIG. 29 to FIG. 30 are cross-sectional views of intermediate stages in the formation of a semiconductor device in accordance with a second embodiment of the disclosure.
Figure 30:
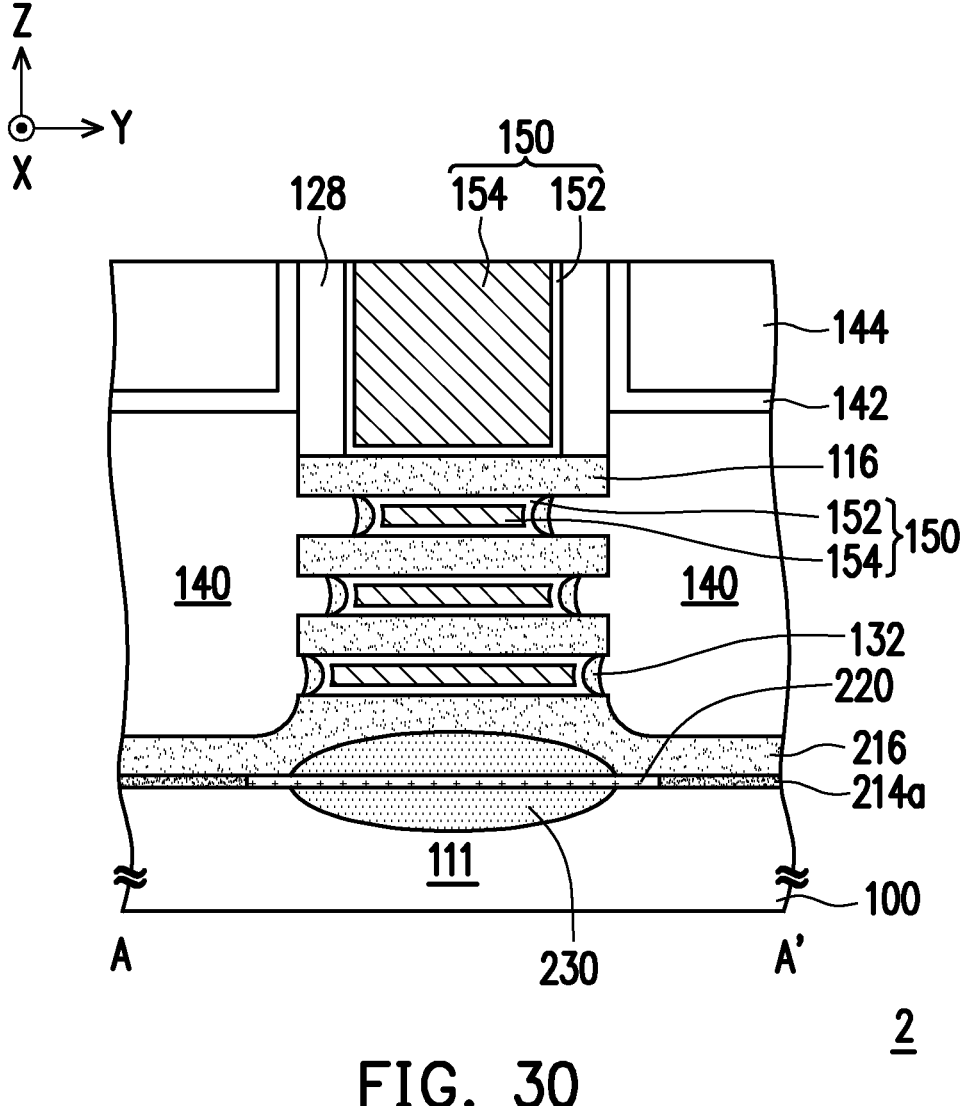

FIG. 29 to FIG. 30 are cross-sectional views of intermediate stages in the formation of a semiconductor device in accordance with a second embodiment of the disclosure.

FIG. 29 illustrates a structure before forming the semiconductor stack 102 shown in FIG. 1. After forming the bottom semiconductor material 204 and the buffer material 206 on the substrate 100, an implantation process 225 may be performed to form a doped region 230 in the buffer material 206, the bottom semiconductor material 204, and the substrate 100. In some embodiments, the doped region 230 is referred to as an anti-punch-through (APT) region. The conductivity type of the dopants implanted in the APT region 230 is the same as that of the wells (not shown) in the substrate 100. On the other hand, the APT region 230 and the subsequently formed source/drain (S/D) regions 140 (FIG. 30) may have different conductivity types. For example, the S/D regions 140 are doped with an n-type dopant for straining an n-type FinFET, the APT region 230 is doped with a p-type dopant to reduce the leakage from the S/D regions 140 to substrate 100, and vice versa. In addition, the APT region 230 may extend under the S/D regions 140 to further reduce the leakage. In some embodiments, the APT region 230 has a doping concentration in a range from about $1 \times 10^{11}/cm^3$ to about $5 \times 10^{13}/cm^3$.

FIG. 29 to FIG. 30 illustrate a method of forming a semiconductor device 2 that has detail steps corresponding to FIG. 1 to FIG. 13. Specifically, after forming the APT region 230, the semiconductor stack 102 is formed on the buffer material 206, as shown in FIG. 1. The semiconductor stack 102, the buffer material 206, the bottom semiconductor material 204, and the substrate 100 are then patterned to form the plurality of fins 111, as shown in FIG. 2. Thereafter, the plurality of isolation regions 115 are formed aside the hybrid fins 110 and the hybrid fins 110 protrude from top surfaces 115*t* of the isolation regions 115, as shown in FIGS. 3-4. Next, the dummy gate stack 122 is formed across the nanosheet stacks 112, as shown in FIGS. 5-6. The S/D regions 140 are then formed at opposite sides of the dummy gate stack 122, as shown in FIGS. 7-8. Thereafter, the ILD layer 144 are formed on the S/D regions 140, and the dummy gate stack 122 is removed to form the gate trench 16, as shown in FIG. 9. Next, the first etching process is performed to remove the first nanosheets 114 and a portion of the bottom semiconductor layer 214, so as to form the first gap 218 between the fin 111 and the buffer layer 216 and form the second gaps 18 between the second nanosheets 116, as shown in FIG. 10. Next, the bottom dielectric layer 220 is formed in the first gap 218, as shown in FIGS. 11-12. The gate stack 150 is then formed in the gate trench 16 and the second gaps 18, as shown in FIG. 13. The gate stack 150 may include the gate dielectric layer 152 wrapping the second nanosheets 116 and the gate electrode 154 covering the gate dielectric layer 152. After forming the gate stack 150, the semiconductor device 2 of the second embodiment is accomplished, as shown in FIG. 13. In the present embodiment, the bottom dielectric layer 220 and the APT region 230 above and below the bottom dielectric layer 220 can further block the punch through leakage current between adjacent S/D regions 140, thereby enhancing the device performance and the reliability.

In some alternative embodiments, the bottom dielectric layer 220 and the gate dielectric layer 152 have the same material. In this case, the second etching process as illustrated in FIG. 11 to FIG. 12 may be omitted. That is, the bottom dielectric material (219) may be used as the gate dielectric layer, the gate electrode 154 then covers on the bottom dielectric material to form the gate stack 150.

According to some embodiments, a semiconductor device includes a substrate, a plurality of semiconductor nanosheets, a bottom dielectric layer, and a gate stack. The substrate includes at least one fin. The plurality of semiconductor nanosheets are stacked on the at least one fin. The bottom dielectric layer is vertically disposed between the at least one fin and the plurality of semiconductor nanosheets. The gate stack wraps the plurality of semiconductor nanosheets. An area of the gate stack projected on a top surface of the substrate is within an area of the bottom dielectric layer projected on the top surface of the substrate.

According to some embodiments, a semiconductor device includes a bottom layer, a plurality of Si nanosheets, a gate stack, and source/drain (S/D) regions. The bottom layer overlays a substrate. The bottom layer includes a bottom dielectric layer embedded in a bottom semiconductor layer, and the bottom dielectric layer and the bottom semiconductor layer are at a same level and connected to each other. The plurality of Si nanosheets are vertically stacked on the bottom dielectric layer. The gate stack wraps the plurality of Si nanosheets. The S/D regions are disposed at opposite sides of the gate stack and connected to the plurality of Si nanosheets.

According to some embodiments, a method of forming a semiconductor device includes: forming a bottom layer on a substrate, wherein the bottom layer comprises a bottom dielectric layer embedded in a bottom semiconductor layer, and the bottom dielectric layer and the bottom semiconductor layer are at a same level and connected to each other; forming a plurality of Si nanosheets vertically stacked on the bottom dielectric layer; forming a gate stack to wrap the plurality of Si nanosheets; and forming source/drain (S/D) regions at opposite sides of the gate stack to connect the plurality of Si nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising at least one fin;
a gate structure disposed over the substrate;
a first source/drain (S/D) region disposed over the substrate at a first side of the gate structure;
a second S/D region disposed over the substrate at a second side of the gate structure;
a bottom dielectric layer disposed between the gate structure and the substrate and extending continuously along an extending direction of the fin from directly under the first S/D region across the gate structure to directly below the second S/D region with the same thickness; and
a bottom semiconductor layer disposed aside and in contact with the bottom dielectric layer.

2. The semiconductor device of claim 1, wherein the bottom dielectric layer and the gate structure are physically separated from each other.

3. The semiconductor device of claim 1, further comprising:
a buffer layer vertically disposed between the gate structure and the bottom dielectric layer, and extending from the first S/D region to the second S/D region.

4. The semiconductor device of claim 3, wherein the bottom dielectric layer further extends below the first and second S/D regions, and the bottom dielectric layer is separated from the first and second S/D regions by the buffer layer.

5. The semiconductor device of claim 1, further comprising an anti-punch-through (APT) region wraps the bottom dielectric layer.

6. The semiconductor device of claim 5, wherein the APT region has a conductivity type different from a conductivity type of the first and second S/D regions.

7. The semiconductor device of claim 1, wherein a lateral width of the bottom dielectric layer is greater than or equal to a lateral width of the gate structure.

8. The semiconductor device of claim 1, further comprising a plurality of inner spacers respectively disposed between the first and second S/D regions and the gate structure.

9. A semiconductor device, comprising:
a doped region disposed in a substrate comprising at least one fin;
a bottom dielectric layer disposed on the doped region;
a bottom semiconductor layer disposed aside and in contact with the bottom dielectric layer;
a gate structure disposed on the bottom dielectric layer; and
source/drain (S/D) regions disposed on the bottom dielectric layer at opposite sides of the gate structure, wherein the bottom dielectric layer is configured to prevent dopants in the doped region from diffusing into the S/D regions, wherein the bottom dielectric layer extends continuously along an extending direction of the fin from directly under one of the S/D regions across the gate structure to directly below the other of the S/D regions with the same thickness.

10. The semiconductor device of claim 9, further comprising: a buffer layer disposed between the gate structure and the bottom dielectric layer, wherein the buffer layer is physically isolated from the doped region by the bottom dielectric layer.

11. The semiconductor device of claim 10, wherein the bottom dielectric layer is separated from the S/D regions by the buffer layer.

12. The semiconductor device of claim 9,
wherein a material of the bottom dielectric layer is different from a material of the bottom semiconductor layer.

13. The semiconductor device of claim 12, wherein an electrical conductivity of the bottom dielectric layer is less than an electrical conductivity of the bottom semiconductor layer.

14. The semiconductor device of claim 12, further comprising an anti-punch-through (APT) region wraps the bottom dielectric layer.

15. The semiconductor device of claim 14, wherein the APT region has a conductivity type different from a conductivity type of the S/D regions.

16. The semiconductor device of claim 14, wherein the APT region has a conductivity type same as a conductivity type of the doped region.

17. The semiconductor device of claim 9, wherein the bottom dielectric layer and the gate structure are physically separated from each other.

18. A method of forming a semiconductor device, comprising:
forming a gate structure over a substrate comprising at least one fin;
forming a first source/drain (S/D) region over the substrate at a first side of the gate structure;
forming a second S/D region over the substrate at a second side of the gate structure;
forming a bottom dielectric layer between the gate structure and the substrate, wherein the bottom dielectric layer extends continuously along an extending direction of the fin from directly under the first S/D region across the gate structure to directly below the second S/D region with the same thickness; and
forming a bottom semiconductor layer aside the bottom dielectric layer, wherein the bottom semiconductor layer is in contact with the bottom dielectric layer.

19. The method of claim 18, further comprising:
forming a buffer layer on the bottom dielectric layer, wherein the buffer layer is vertically disposed between the bottom dielectric layer and the gate structure; and
after forming the buffer layer, performing an implantation process to form a doped region in the buffer layer and the substrate.

20. The method of claim 19, wherein the doped region has a conductivity type different from a conductivity type of the first and second S/D regions.

* * * * *